(12) United States Patent
Kim et al.

(10) Patent No.: US 11,614,832 B2
(45) Date of Patent: Mar. 28, 2023

(54) DISPLAY DEVICE

(71) Applicant: Samsung Display Co., LTD., Yongin-si (KR)

(72) Inventors: Min Joo Kim, Seongnam-si (KR); Ki Cheol Kim, Yongin-si (KR); Won Kyu Kwak, Seongnam-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 28 days.

(21) Appl. No.: 17/406,053

(22) Filed: Aug. 18, 2021

(65) Prior Publication Data
US 2022/0100346 A1 Mar. 31, 2022

(30) Foreign Application Priority Data

Sep. 29, 2020 (KR) .................. 10-2020-0127073

(51) Int. Cl.
| | |
|---|---|
| *G06F 3/041* | (2006.01) |
| *G06F 3/044* | (2006.01) |
| *H01L 27/32* | (2006.01) |
| *H01L 51/00* | (2006.01) |
| *G09G 3/00* | (2006.01) |

(52) U.S. Cl.
CPC ........ *G06F 3/04184* (2019.05); *G06F 3/0443* (2019.05); *G06F 3/04164* (2019.05); *H01L 27/323* (2013.01); *H01L 27/3276* (2013.01); *H01L 51/0097* (2013.01); *G06F 3/0446* (2019.05); *G09G 3/006* (2013.01); *H01L 2251/5338* (2013.01)

(58) Field of Classification Search
CPC .... G06F 3/041; G06F 3/04164; G06F 3/0443; G06F 3/044; G06F 3/0412; G06F 3/006; H01L 27/3276; H01L 27/323
See application file for complete search history.

(56) References Cited

U.S. PATENT DOCUMENTS

| | | | |
|---|---|---|---|
| 11,409,395 B2* | 8/2022 | Lee | G06F 3/0445 |
| 2017/0228074 A1* | 8/2017 | Du | G06F 3/0412 |
| 2020/0090567 A1* | 3/2020 | Lee | G09G 3/3266 |

FOREIGN PATENT DOCUMENTS

| | | |
|---|---|---|
| KR | 1020150027529 | 3/2015 |
| KR | 101623776 | 6/2016 |
| KR | 1020170026714 | 3/2017 |
| KR | 1020180025533 | 3/2018 |

* cited by examiner

*Primary Examiner* — Sardis F Azongha
(74) *Attorney, Agent, or Firm* — Cantor Colburn LLP

(57) ABSTRACT

A display device includes a first area including a display area, a second area including a pad area, a bending area disposed between the first area and the second area, a plurality of touch signal lines extending from the second area to the first area through the bending area, a plurality of touch test lines disposed in the second area and separated and spaced apart from the plurality of touch signal lines, and a plurality of touch connection lines electrically connecting the plurality of touch signal lines and the plurality of touch test lines, wherein, in the second area, the plurality of touch signal lines and the plurality of touch test lines include a first conductive layer, and the plurality of touch connection lines includes a second conductive layer different from the first conductive layer.

20 Claims, 20 Drawing Sheets

EMA: EMA_R, EMA_G, EMA_B

DISPLAY DEVICE

This application claims priority to Korean Patent Application No. 10-2020-0127073, filed on Sep. 29, 2020, and all the benefits accruing therefrom under 35 U.S.C. § 119, the content of which in its entirety is herein incorporated by reference.

BACKGROUND

1. Field

Embodiments of the invention relate to a display device.

2. Description of the Related Art

A display device for displaying an image is used for various electronic appliances for providing an image to a user, such as smart phones, tablet personal computers ("PCs"), digital cameras, notebook computers, navigators, and televisions. A display device includes a display panel for generating and displaying an image and various input devices.

Recently, mainly in the field of smart phones and tablet PCs, a touch panel recognizing a touch input is applied to a display device. The touch panel determines whether or not an input is performed, and calculates the corresponding position as touch input coordinates. The touch panel includes a plurality of touch signal lines, and further includes test lines capable of testing characteristics of the touch panel.

SUMMARY

Features of the invention are to provide a display device to which a driving chip for both driving a display panel and driving a touch member is applied and which may suppress coupling and short failures between a touch line of the touch member and a test line.

However, features of the invention are not restricted to the one set forth herein. The above and other features of the invention will become more apparent to one of ordinary skill in the art to which the invention pertains by referencing the detailed description of the invention given below.

An embodiment of a display device includes a first area including a display area, a second area including a pad area, a bending area disposed between the first area and the second area, a plurality of touch signal lines extending from the second area to the first area through the bending area, a plurality of touch test lines disposed in the second area and separated and spaced apart from the plurality of touch signal lines, and a plurality of touch connection lines electrically connecting the plurality of touch signal lines and the plurality of touch test lines, wherein, in the second area, the plurality of touch signal lines and the plurality of touch test lines include a first conductive layer, and the plurality of touch connection lines includes a second conductive layer different from the first conductive layer.

An embodiment of a display device includes a first area including a display area, a second area including a pad area, a bending area disposed between the first area and the second area, a plurality of touch signal lines extending from the second area to the first area through the bending area, a plurality of touch test lines disposed in the second area and separated and spaced apart from the plurality of touch signal lines, and a plurality of touch connection lines electrically connected to the plurality of touch signal lines and the plurality of touch test lines, wherein, in the second area, the plurality of touch signal lines intersect the plurality of touch connection lines, and do not intersect the plurality of touch test lines in a plan view.

An embodiment of a display device includes a first area including a display area, a second area including a pad area, a bending area disposed between the first area and the second area, a plurality of touch signal lines extending from the second area to the first area through the bending area, a plurality of touch test lines disposed in the second area and separated and spaced apart from the plurality of touch signal lines, and a plurality of touch connection lines electrically connecting the plurality of touch signal lines and the plurality of touch test lines, wherein the display device includes a substrate, a gate conductive layer disposed on the substrate, a first insulating layer disposed on the gate conductive layer, a data conductive layer disposed on the first insulating layer, a second insulating layer disposed on the data conductive layer, and a touch conductive layer disposed on the second insulating layer, wherein, in the second area, the plurality of touch signal lines and the plurality of touch test lines include the touch conductive layer, and the plurality of touch connection lines includes the gate conductive layer.

In an embodiment, in the display device to which a driving chip for both driving a display panel and driving a touch member is applied, it is possible to suppress coupling and short failures between a touch line of the touch member and a test line.

The effects of the invention are not limited by the foregoing, and other various effects are anticipated herein.

BRIEF DESCRIPTION OF THE DRAWINGS

The above and other embodiments and features of the invention will become more apparent by describing in detail embodiments thereof with reference to the attached drawings, in which.

DETAILED DESCRIPTION

Figure 1:
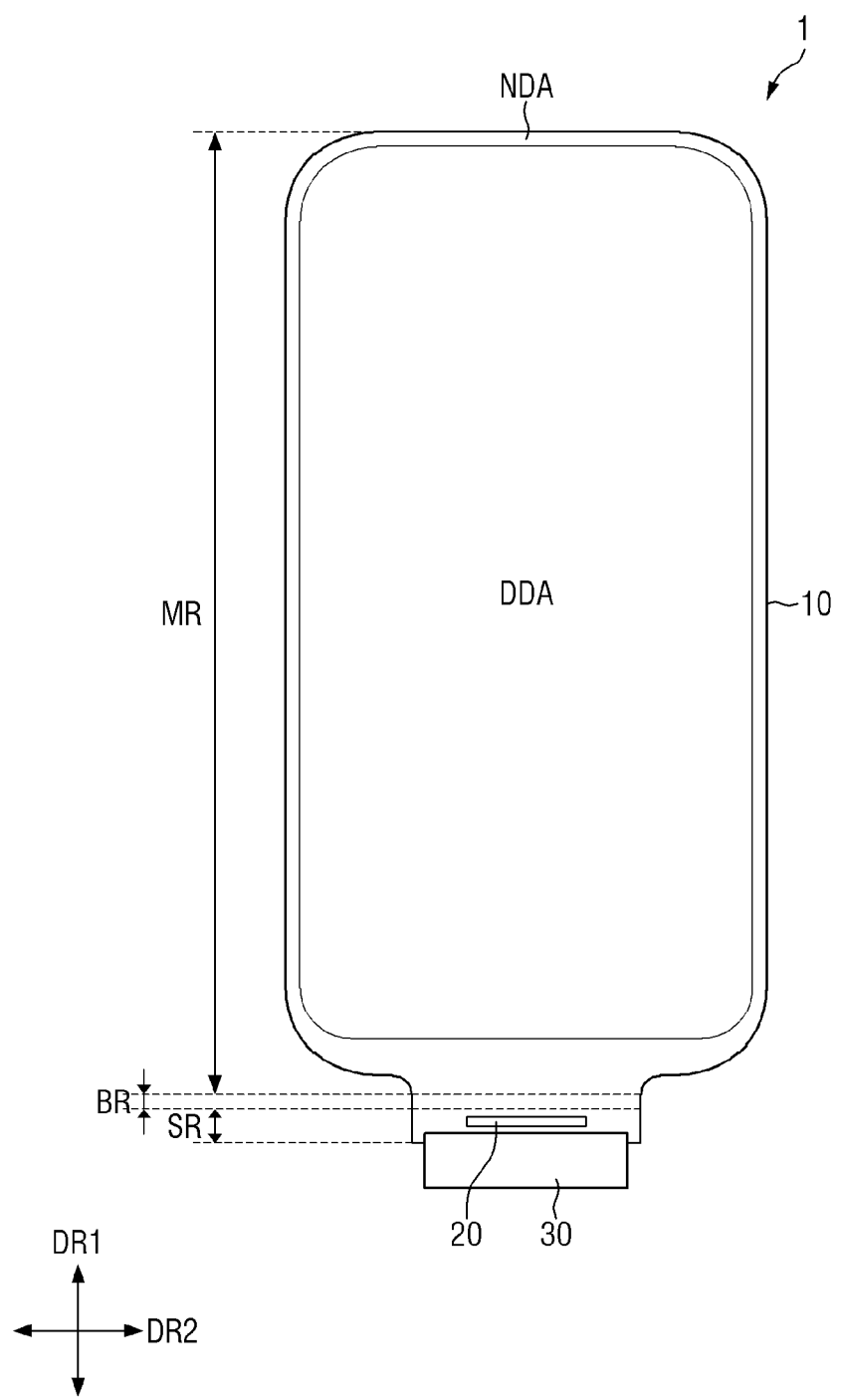
FIG. 1 is a plan view of an embodiment of a display device.

Embodiments of the invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this invention will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification. In the attached drawing figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Hereinafter, embodiments of the invention will be described with reference to the attached drawings.

Figure 2:
FIG. 2 is a schematic partial cross-sectional view of an embodiment of a display device.

FIG. 1 is a plan view of an embodiment of a display device, and FIG. 2 is a schematic partial cross-sectional view of an embodiment of a display device.

In an embodiment, a first direction DR1 and a second direction DR2 cross each other in different directions. In the plan view of FIG. 1, for convenience of description, the first direction DR1 which is a vertical direction and the second direction DR2 which is a horizontal direction are defined. In the following embodiments, one side of the first direction DR1 refers to an upward direction in the plan view, the other side of the first direction DR1 refers to a downward direction in the plan view, one side of the second direction DR2 refers to a right direction in the plan view, and the other side of the second direction DR2 refers to a left direction in the plan view. However, the directions mentioned in the embodiments should be understood to refer to relative directions, and the embodiments are not limited to the aforementioned directions.

Referring to FIGS. 1 and 2, a display device 1, which is a device for displaying a moving image or a still image, may be used as a display screen of various products such as televisions, notebooks, monitors, billboards, internet of things ("IOTs") as well as portable electronic appliances such as mobile phones, smart phones, tablet personal computers (tablet "PCs"), smart watches, watch phones, mobile communication terminals, electronic notebooks, electronic books, portable multimedia players ("PMPs"), navigators, and ultra mobile PCs ("UMPCs"). Examples of the display device may include an organic light emitting display device, a liquid crystal display device, a plasma display device, a field emission display device, an electrophoretic display device, an electrowetting display device, a quantum dot light emitting display device, and a micro light emitting diode (micro "LED") display device. Hereinafter, an organic light emitting display device will be described as the display device 1 as an example, but the invention is not limited thereto.

The display device 1 may include a display panel 10. In addition, the display device 1 may include a touch member. The touch member may be provided as an additional panel or film separated from the display panel 10 and attached onto the display panel 10, but may be provided in the form of a touch layer inside the display panel 10. In the following embodiments, a case where the touch member is provided inside the touch panel and included in the display panel 10 is illustrated, but the invention is not limited thereto.

The display panel 10 may include a flexible substrate including a flexible polymer material such as polyimide. Accordingly, the display panel 10 may be warped, bent, folded, or rolled.

The display panel 10 may include a bending area BR where the display panel 10 is bent. The display panel 10 may be divided into a first area and a second area based on the bending area BR. The first area is disposed at one side of the bending area BR, and the second area is disposed at the other side of the bending area BR. The first area may be a main area MR including the display area DDA. The second area may be a sub-area SR including a pad area. When the area displaying a screen is defined as the display area DDA and the area not displaying the screen is defined as the non-display area NDA, the display area DDA of the display panel is disposed in the main area MR. The remaining portion of the display panel, except for the display area DDA, may be the non-display area NDA. In an embodiment, in the main area MR, the peripheral edge portion of the display area DDA, the entire bending area BR, and the entire sub-area SR may be the non-display area NDA. However, the invention is not limited thereto, and the bending area BR and/or the sub-area SR may also include the display area DDA.

The main area MR may generally have a shape similar to the planar appearance of the display device 1. The main area MR may be a flat area disposed in one plane. However, the invention is not limited thereto, and at least one of the remaining edges other than the edge (side) connected to the bending area BR may be curved in the main area MR to form a curved surface or bend in the vertical direction.

The display area DDA of the display panel may be disposed at the center of the main area MR. The display area DDA may include a plurality of pixels. The touch area of the touch member may overlap the display area DDA or may be disposed inside the display area DDA.

The display area DDA may have a quadrangular (e.g., rectangular) shape including sharp corners or a quadrangular (e.g., rectangular) shape including rounded corners. The exemplified shape of the display area DDA is a rectangle in which the corners thereof are round and the length thereof in the first direction DR1 is longer than the length thereof in the second direction DR2. However, the invention is not limited thereto, and the display area DDA may have various shapes such as a rectangular shape in which the length thereof in the second direction DR2 is longer than the length thereof in the first direction DR1, a square shape or other polygonal shapes, a circular shape, and an elliptic shape.

When at least one of the remaining edges other than the edge (side) connected to the bending area BR may be curved or bent in the main area MR, the display area may also be disposed at the corresponding edge. However, the invention is not limited thereto, and the curved or bent edge may be provided with a non-display area that does not display the screen, or may be provided with both the display area and the non-display area.

The non-display area NDA may be disposed around the display area DDA in the main area MR. The non-display area NDA of the main area MR may be placed in an area from the outer boundary of the display area DDA to the edge of the display panel 10. Signal lines for applying signals to the display area DDA and/or the touch area, or driving circuits may be arranged in the non-display area NDA of the main area MR, Further, the outermost black matrix may be disposed in the non-display area NDA of the main area MR, but the invention is not limited thereto.

The bending area BR is connected to the other side of the main area MR in the first direction DR1. In an embodiment, the bending area BR may be connected through the lower short side of the main area MR, for example. The width of the bending area BR in the second direction DR2 may be smaller than the width (width of short side) of the main area MR in the second direction DR2. The connection portion of the main area MR and the bending area BR may have an L-shaped cutting shape.

In the bending area BR, the display panel 10 may be bent with curvature in a downward direction in the thickness direction, that is, in a direction opposite to a display surface. The bending area BR may have a constant radius of curvature, but is not limited thereto, and may have a different radius of curvature for each section. As the display panel 10 is bent in the bending area BR, the surface of the display panel 10 may be reversed. That is, one surface of the display panel 10 facing upward may be changed to face outward through the bending area BR and then face downward.

The sub-area SR extends from the bending area BR. The sub-area SR may extend in a direction parallel to the main area MR immediately after the bending is completed. The sub-area SR may overlap the main area MR in the thickness direction of the display panel 10. The sub-area SR may overlap the non-display area NDA at the edge of the main area MR, and may further overlap the display area DDA of the main area MR.

The width of the sub-area SR in the second direction DR2 may be equal to the width of the bending area BR in the second direction DR2, but the invention is not limited thereto.

A driving chip 20 may be disposed in the sub-area SR. The driving chip 20 may include an integrated circuit ("IC") for driving the display panel 10. In an embodiment, the IC may be a display data driving IC that generates and provides a data signal, but is not limited thereto. The driving chip 20 may be disposed (e.g., mounted) on the display panel 10 in the sub-area SR. The driving chip 20 is disposed (e.g., mounted) on one surface of the display panel 10 that is the same surface as the display surface, but, as described above, may be disposed (e.g., mounted) on the surface of the display panel 10 facing downward in the thickness direction to allow the upper surface of the driving chip 20 to face downward as the bending area is bent and inverted.

The driving chip 20 may be attached to the display panel 10 through an anisotropic conductive film, or may be attached to the display panel 10 through ultrasonic bonding. The width of the driving chip 20 in the horizontal direction (the second direction DR2) may be smaller than the width of the display panel 10 in the horizontal direction (the second direction DR2). The driving chip 20 may be disposed at the center of the sub-area SR in the horizontal direction (the second direction DR2), and both sides of the driving chip 20 may be spaced apart from the left and right edges of the sub-area SR.

The driving chip 20 may be an integrated driving chip that applies a driving signal of a touch member while applying a display driving signal. In other words, the driving chip 20 may be a driver IC in which a display driver IC and a touch driver IC are integrated. In an embodiment, the driving chip 20 may be a chip on plastic ("COP"), but is not limited thereto.

A pad area may be disposed at an end of the sub-area SR of the display panel 10. The pad area may include a plurality of display signal line pads and a plurality of touch signal line pads. When the driving chip 20 transmits a driving signal and a driving signal of the touch member together, the plurality of display signal lines and the plurality of touch signal lines may be electrically connected to the driving chip 20, and the driving chip 20 may be electrically connected to the plurality of display signal line pads and the plurality of touch signal line pads.

A driving substrate 30 may be connected to the pad area provided at the end of the sub-area SR of the display panel 10. The driving substrate 30 may be a flexible printed circuit board or a film. The driving substrate 30 may be an integrated driving substrate 30 that drives a display and drives a touch member. However, the invention is not limited thereto, and a separate display driving substrates and a touch driving substrate may be attached to the sub-area SR of the display panel 10.

Figure 3:
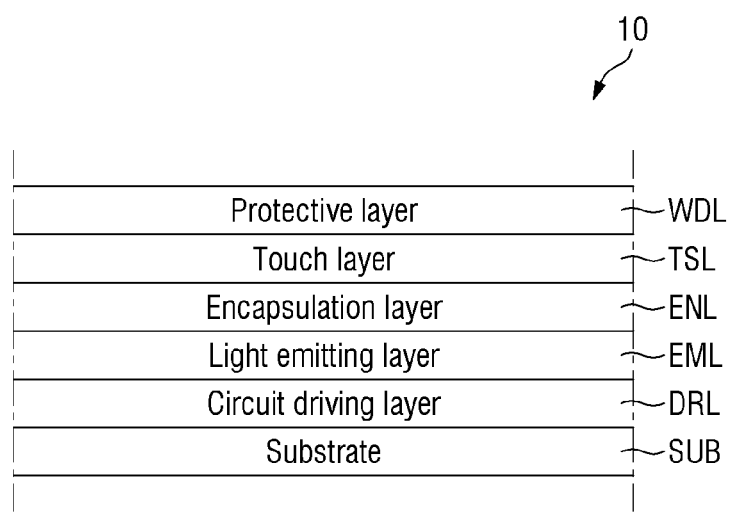
FIG. 3 is a schematic cross-sectional view illustrating an embodiment of a laminate structure of a display panel.

FIG. 3 is a schematic cross-sectional view illustrating an embodiment of a laminate structure of a display panel.

Referring to FIG. 3, the display panel 10 may include a circuit driving layer DRL disposed on a substrate SUB. The circuit driving layer DRL may include a circuit for driving a light emitting layer EML of a pixel. The circuit driving layer DRL may include a plurality of thin film transistors ("TFTs").

A light emitting layer EML may be disposed on the circuit driving layer DRL. The light emitting layer EML may include an organic light emitting layer. The light emitting layer EML may emit light with various luminance according to a driving signal transmitted from the circuit driving layer DRL.

An encapsulation layer ENL may be disposed on the light emitting layer EML. The encapsulation layer ENL may include an inorganic film or a laminated film of an inorganic film and an organic film. In another embodiment, a glass or an encapsulation film may be applied as the encapsulation layer ENL.

A touch layer TSL may be disposed on the encapsulation layer ENL. The touch layer TSL is a layer that recognizes a touch input, and may function as a touch member. The touch layer TSL may include a plurality of sensing areas and a plurality of sensing electrodes.

A protective layer WDL may be disposed on the touch layer TSL. The protective layer WDL may include, for example, a window member. The protective layer WDL may be attached onto the touch layer TSL by an optically clear adhesive or the like.

Although not shown, the display panel 10 may further include an optical member. In an embodiment, an optical member such as a polarizing film may be interposed between the touch layer TSL and the protective layer WDL, for example.

Hereinafter, the aforementioned touch member will be described in detail.

Figure 4:
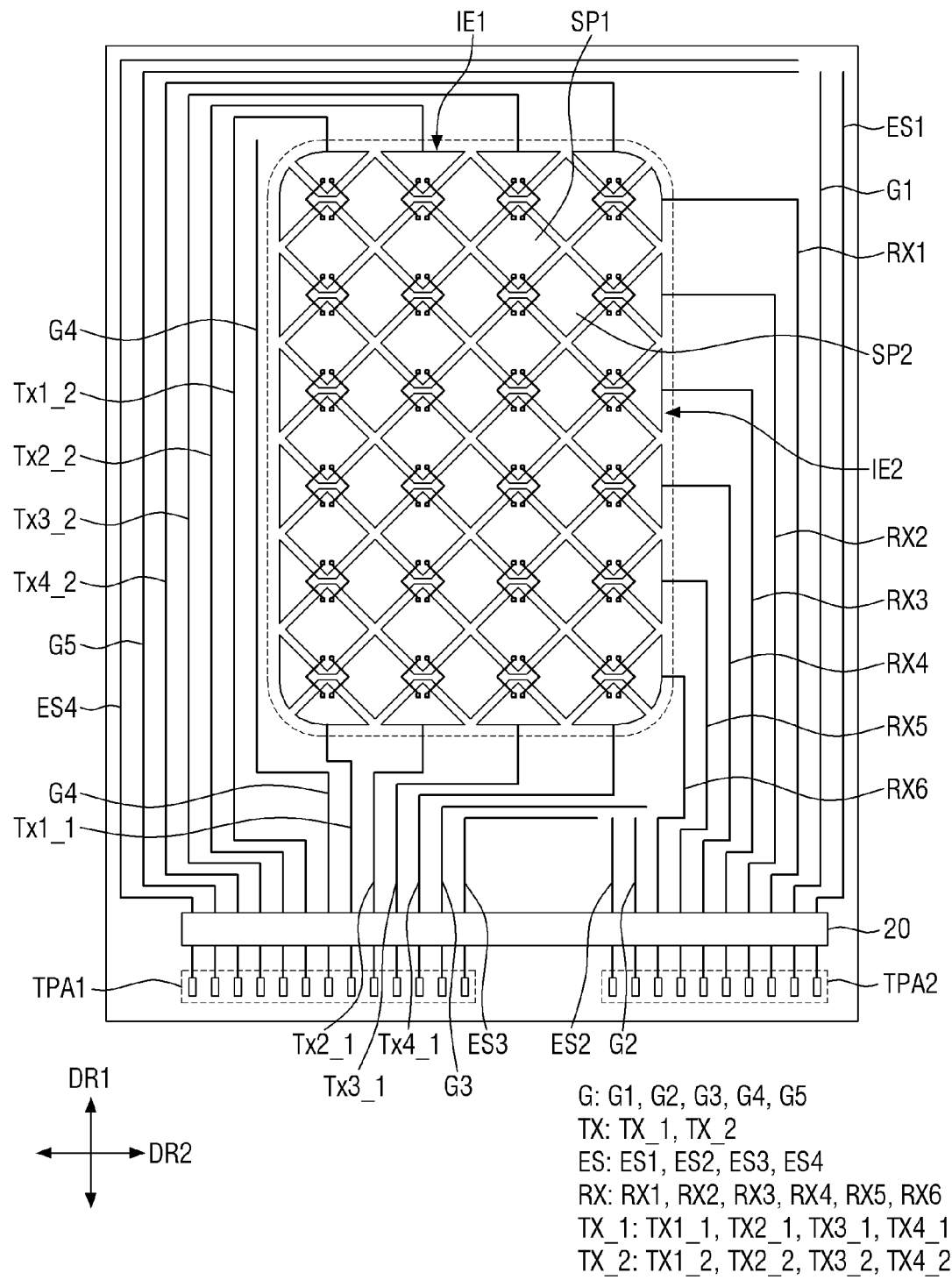
FIG. 4 is a schematic plan view of an embodiment of a touch member.

FIG. 4 is a schematic plan view of an embodiment of a touch member.

Referring to FIG. 4, the touch member includes a touch area that is an active area and a non-touch area that is a non-active area. The touch area may overlap the above-described display area DDA, and the non-touch area may overlap the above-described non-display area NDA. For convenience of explanation, although it is shown in FIG. 4 that the overall shape of the touch member are simplified and the non-touch area is relatively wide, the shape of the touch area and the shape of the non-touch area may be substantially the same as the shape of the display area DDA and the shape of the non-display area NDA, respectively. Hereinafter, the non-touch area will be also referred to as the non-display area NDA unless otherwise specified.

The touch area of the touch member includes a plurality of first sensing electrodes IE1 (or first touch electrodes) and a plurality of second sensing electrodes IE2 (or second touch electrodes). Any one of the first sensing electrode IE1 and the second sensing electrode IE2 may be a driving electrode, and the other thereof may be a sensing electrode. In the illustrated embodiment, a case where the first sensing electrode IE1 is a driving electrode and the second sensing electrode IE2 is a sensing electrode is exemplified.

The first sensing electrode IE1 may extend in the first direction DR1. The first sensing electrode IE1 may include a plurality of first sensor units SP1 arranged along the first direction DR1 and a first connection unit CP1 electrically connecting the adjacent first sensor units SP1. The plurality of first sensing electrodes IE1 may be arranged in the second direction DR2.

The second sensing electrode IE2 may extend in the second direction DR2. The second sensing electrode IE2 may include a plurality of second sensor units SP2 arranged along the second direction DR2 and a second connection unit CP2 electrically connecting the adjacent second sensor units SP2. The plurality of second sensing electrodes IE2 may be arranged in the first direction DR1.

Although it is illustrated in the drawing that four columns of first sensing electrodes IE1 and six rows of second sensing electrodes IE2 are arranged, it is obvious that the number of the first sensing electrodes IE1 and the number of the second sensing electrodes IE2 are not limited to that illustrated above.

Figure 5:
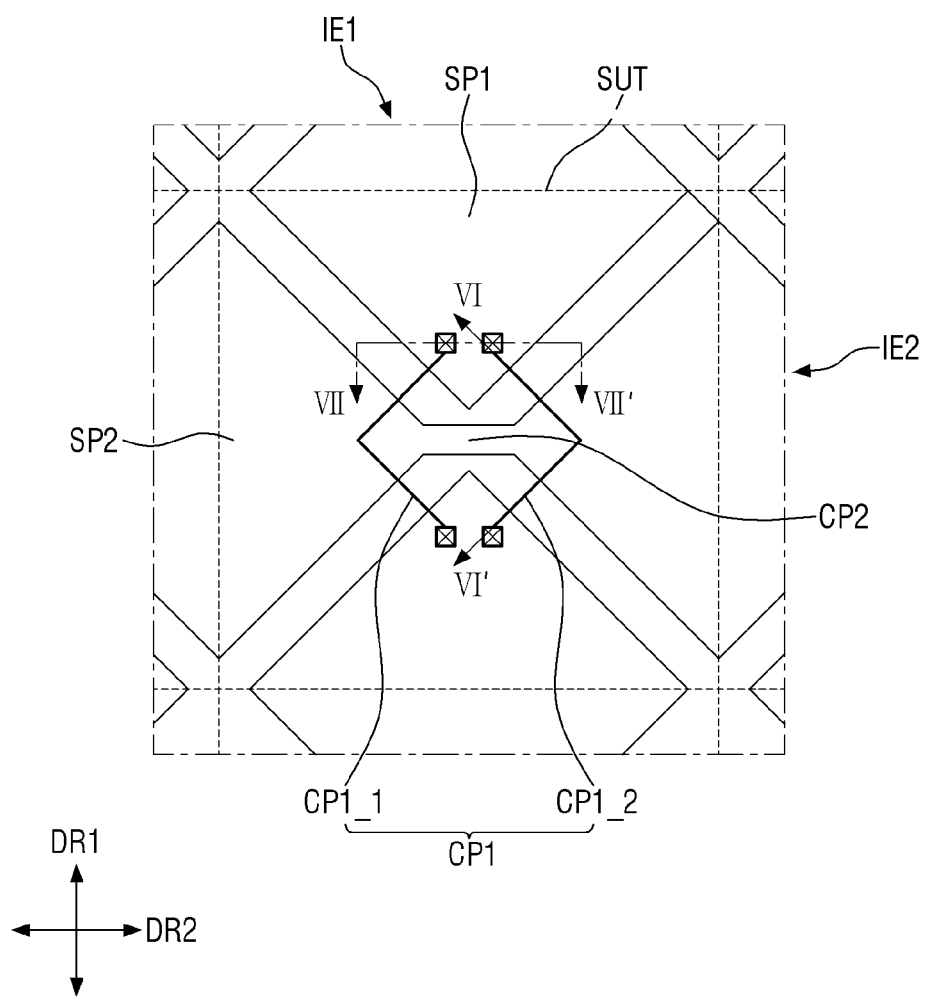
FIG. 5 is a partially enlarged view of the touch area of FIG. 4.

FIG. 5 is a partially enlarged view of the touch area of FIG. 4.

Referring to FIGS. 4 and 5, at least some of the first sensor units SP1 and the second sensor units SP2 may have a rhombus shape. Some first sensor units SP1 and some second sensor units SP2 may have a figure shape cut from a rhombus shape. In an embodiment, all of the first sensor units SP1 and the second sensor units SP2 except for both ends in the extension direction have a rhombus shape, and the first sensor units SP1 and the second sensor units SP2 disposed at both ends in the extension direction may have a triangular shape in which a rhombus is cut in half, for example. The first sensor units SP1 having a rhombus shape and the second sensor units SP2 having a rhombus shape may be substantially the same as each other in sizes and shapes. The first sensor units SP1 having a triangular shape and the second sensor units SP2 having a triangular shape may be substantially the same as each other in sizes and shapes. However, embodiments are not limited to that illustrated above, and the shapes and sizes of the first sensor units SP1 and the second sensor units SP2 may be variously modified.

The first connection unit CP1 may connect rhombus or triangular corners of the adjacent first sensor units SP1. The second connection unit CP2 may connect rhombus or triangular corners of the adjacent second sensor units SP2. The width of each of the first connection unit CP1 and the second connection unit CP2 may be smaller than the width of each of the first sensor unit SP1 and the second sensor unit SP2.

The first sensing electrode IE1 and the second sensing electrode IE2 may insulate and intersect each other. Insulation between the first sensing electrode IE1 and the second sensing electrode IE2 may be secured by being connected through a conductive layer disposed in a different layer in an area intersecting each other. The intersection of the first sensing electrode IE1 and the second sensing electrode IE2 may be provided by the first connection unit CP1 and/or the second connection unit CP2. For insulation and intersection, at least one of the first connection unit CP1 and the second connection unit CP2 may be disposed in a different layer from the first sensing electrode IE1 and the second sensing electrode IE2.

In an embodiment, the first sensor unit SP1 of the first sensing electrode IE1 and the second sensor unit SP2 of the second sensing electrode IE2 may include a conductive layer disposed in the same layer, and the first sensor unit SP1 itself and the second sensor unit SP2 itself may not intersect or overlap each other, for example. The adjacent first sensor unit SP1 and second sensor unit SP2 may be physically spaced apart from each other.

The second connection unit CP2 may include the same conductive layer as the second sensor unit SP2 to connect the adjacent second sensor units SP2. The first sensor units SP1 adjacent to the first sensing electrode IE1 are physically spaced apart from each other based on the area through which the second connection unit CP2 passes. The first connection unit CP1 connecting the first sensor units SP1 may include a different conductive layer from the first sensor unit SP1 to traverse the area of the second sensing electrode IE2. The first connection unit CP1 may be electrically connected to each adjacent first sensor unit SP1 through a contact.

A plurality of first connection units CP1 may be provided. In an embodiment, although not limited thereto, the first connection unit CP1 may include one first connection unit CP1_1 overlapping and passing the second sensing electrode IE2 at one adjacent side, and another first connection unit CP1_2 overlapping and passing the second sensing electrode IE2 at the other adjacent side, for example. When a plurality of first connection units CP1 connecting two adjacent first sensor units SP1 is provided, the disconnection of the corresponding first sensing electrode IE1 may be prevented even when any one of the first connection units CP1 is disconnected due to static electricity or the like.

The first sensor units SP1 and the second sensor units SP2 adjacent to each other may constitute a unit sensing area SUT. In an embodiment, with respect to the area where the first sensing electrode IE1 intersects the second sensing electrode IE2 intersect, half of the adjacent two first sensor units SP1 and half of the adjacent two second sensor units SP2 form one square or rectangle, for example. Such an area defined by half of the adjacent two first sensor units SP1 and half of the adjacent two second sensor units SP2 may be one unit sensing area SUT. The plurality of unit sensing areas SUT may be arranged in a matrix direction.

In each unit sensing area SUT, a capacitance value between the adjacent first sensor unit SP1 and second sensor unit SP2 may be measured, thereby determining whether or not a touch is input and calculating the corresponding position as touch input coordinates. Touch sensing may be performed in a self-cap method, but the invention is not limited thereto.

Each unit sensing area SUT may have a larger size than that of a pixel. In an embodiment, the unit sensing area SUT may correspond to a plurality of pixels, for example. The length of one side of the unit sensing area SUT may be in a range of about 4 millimeters (mm) to about 5 mm, but is not limited thereto.

Referring to FIG. 4, a plurality of touch signal lines is disposed in the non-display area NDA outside the touch area. The touch signal line extends from the touch pad area TPA disposed in the sub-area SR to the non-display area NDA of the main area MR through the driving chip 20 and the bending area BR.

The plurality of touch signal lines includes a plurality of touch driving lines TX and a plurality of touch sensing lines RX. The plurality of touch signal lines may further include a touch ground line G and/or a touch antistatic line ES.

The touch driving line TX is connected to the first sensing electrode IE1. In an embodiment, a plurality of touch driving lines may be connected to one first sensing electrode IE1. In an embodiment, the touch driving line TX may include first touch driving lines TX1_1, TX2_1, TX3_1, and TX4_1 connected to the lower end of the first sensing electrode IE1 and second touch driving lines TX1_2, TX2_2, TX3_2, and TX4_2 connected to the upper end of the first sensing electrode IE1, for example. The first touch driving lines TX1_1, TX2_1, TX3_1, and TX4_1 may extend from the touch pad area (also referred to as a touch signal line pad area) TPA to one side in the first direction DR1, and may be connected to the lower end of the first sensing electrode IE1 through the driving chip 20. The second touch driving lines TX1_2, TX2_2, TX3_2, and TX4_2 may extend from the touch signal line pad area TPA to one side in the first direction DR1, and may be connected to the upper end of the first sensing electrode IE1 by bypassing the left edge of the touch area through the driving chip 20.

The touch sensing line RX is connected to the second sensing electrode IE2. In an embodiment, one touch sensing line RX may be connected to one second sensing electrode IE2. Each of the touch sensing lines RX1, RX2, RX3, RX4, RX5, and RX6 may extend from the touch signal line pad area TPA to one side in the first direction DR1, may extend to the right edge of the touch area through the driving chip 20, and may be connected to the right end of the second sensing electrode IE2.

The touch antistatic line ES may be disposed at the outermost portion of the touch signal line. In an embodiment, the touch antistatic line ES may include a first touch antistatic line ES1, a second touch antistatic line ES2, a third touch antistatic line ES3, and a fourth touch antistatic line ES4. The first to fourth touch antistatic lines ES1 to ES4 may surround the touch area and the signal lines in a ring shape.

The first touch antistatic line ES1 may cover the outside of the touch signal line disposed at the right side thereof.

The second touch antistatic line ES2 may cover the inside of the touch signal line disposed at the right side thereof.

The third touch antistatic line ES3 may cover the inside of the touch signal line disposed at the left side thereof and the outside of the touch signal line extending in the second direction DR2 from the lower side of the touch area.

The fourth touch antistatic line ES4 may cover the outside of the touch signal line disposed at the left side thereof and the outside of the touch signal line extending in the second direction DR2 from the upper side of the touch area.

The touch ground line G is disposed between the signal lines. The touch ground line G may include a first touch ground line G1, a second touch ground line G2, a third touch ground line G3, a fourth touch ground line G4, and a fifth touch ground line G5.

The first touch ground line G1 may be disposed between the touch sensing line RX and the first touch antistatic line ES1.

The second touch ground line G2 may be disposed between the second touch antistatic line ES2 and the touch sensing line RX.

The third touch ground line G3 may be disposed between the first touch driving line TX_1 and the third touch antistatic line ES3.

The fourth touch ground line G4 may be disposed between the first touch driving line TX_1 and the second touch driving line TX_2.

The fifth touch ground line G5 may be disposed between the second touch driving line TX_2 and the fourth touch antistatic line ES4.

Figure 6:
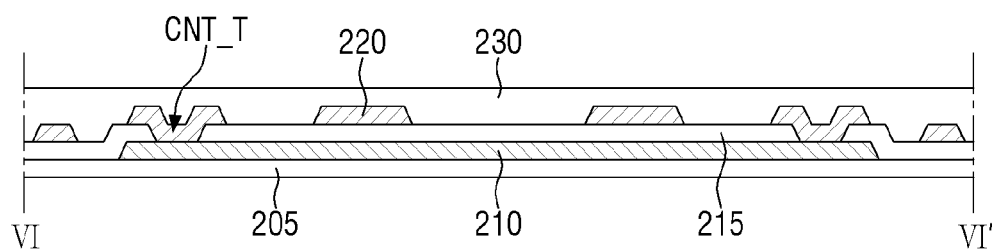
FIG. 6 is a cross-sectional view taken along line VI-VI' of FIG. 5.
Figure 7:
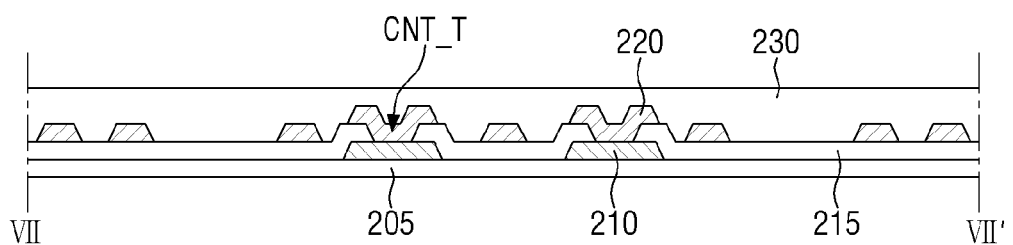
FIG. 7 is a cross-sectional view taken along line VII-VII' of FIG. 5.

FIG. 6 is a cross-sectional view taken along line VI-VI' of FIG. 5. FIG. 7 is a cross-sectional view taken along line VII-VII' of FIG. 5.

Referring to FIGS. 5 to 7, the touch member may include a base layer 205, a first touch conductive layer 210 on the base layer 205, a first touch insulating layer 215 on the first touch conductive layer 210, a second touch conductive layer 220 on the first touch insulating layer 215, and a second touch insulating layer 230 covering the second touch conductive layer 220.

Specifically, the first touch conductive layer 210 is disposed on the base layer 205. The first touch conductive layer 210 is covered by the first touch insulating layer 215. The first touch insulating layer 215 insulates the first touch conductive layer 210 and the second touch conductive layer 220. The second touch conductive layer 220 is disposed on the first touch insulating layer 215. The second touch insulating layer 230 may cover the second touch conductive layer 220 to protect the second touch conductive layer 220.

The base layer 205 may include an inorganic insulating material. In an embodiment, the base layer 205 may include a silicon nitride layer, a silicon oxy nitride layer, a silicon oxide layer, a titanium oxide layer, or an aluminum oxide layer, for example. The base layer 205 may be an inorganic layer constituting a thin film encapsulation layer to be described later.

The first touch conductive layer 210 and the second touch conductive layer 220 may each include a metal layer or a transparent conductive layer. In an embodiment, the metal layer may include aluminum, titanium, copper, molybdenum, silver, or an alloy thereof, for example. In an embodiment, the transparent conductive layer may include a transparent conductive oxide such as indium tin oxide ("ITO"), indium zinc oxide ("IZO"), zinc oxide (ZnO), or indium tin zinc oxide ("ITZO"), a conductive polymer such as poly(3, 4-ethylenedioxythiophene) ("PEDOT"), metal nanowires, or graphene.

The first touch conductive layer 210 and/or the second touch conductive layer 220 may include a conductive layer having a multi-layer structure. In an embodiment, the first touch conductive layer 210 and/or the second touch conductive layer 220 may have a three-layer structure of titanium/aluminum/titanium, for example. In another embodiment, the first touch conductive layer 210 and/or the second touch conductive layer 220 may include at least one metal layer and at least one transparent conductive layer.

In some embodiments, the first touch conductive layer 210 and the second touch conductive layer 220 may include the same material. In an embodiment, both the first touch conductive layer 210 and the second touch conductive layer 220 may include aluminum, for example. In an embodiment, the first touch conductive layer 210 and the second touch conductive layer 220 may have a three-layer structure of titanium/aluminum/titanium.

In other some embodiments, the first touch conductive layer 210 and the second touch conductive layer 220 may include different materials. In an embodiment, the first touch conductive layer 210 may include a metal, and the second touch conductive layer 220 may include a transparent conductive material, for example.

In an embodiment, the above-described first connection unit CP1 may include the first touch conductive layer 210, and the above-described first sensor unit SP1, second sensor unit SP2 and second connection unit CP2 may include the second touch conductive layer 220. However, the invention is not limited thereto, and the touch conductive layer constituting each member of the sensing electrode may be variously modified.

The first sensor unit SP1 of the first sensing electrode IE1 and the second sensor unit SP2 of the second sensing electrode IE2 may have a planar pattern or a mesh pattern, respectively. When the first sensor unit SP1 and the second sensor unit SP2 have a planar pattern, the second touch conductive layer 220 constituting the first sensor unit SP1 and the second sensor unit SP2 may include a transparent conductive layer. When the first sensor unit SP1 and the second sensor unit SP2 have a mesh pattern, the second touch conductive layer 220 constituting the first sensor unit SP1 and the second sensor unit SP2 may include an opaque material. Hereinafter, a case where the first sensor unit SP1 and the second sensor unit SP2 have a mesh pattern will be described as an example, but the invention is not limited thereto.

The first touch insulating layer 215 and the second touch insulating layer 230 may include an inorganic material or an organic material. In an embodiment, any one of the first touch insulating layer 215 and the second touch insulating layer 230 may include an inorganic material, and the other thereof may include an organic material. In an embodiment, the first touch insulating layer 215 may include a silicon nitride layer, a silicon oxy nitride layer, a silicon oxide layer, a titanium oxide layer, or an aluminum oxide layer, and the second touch insulating layer 230 may including an organic layer at least one of acrylic resin, methacrylic resin, polyisoprene, vinyl resin, epoxy resin, urethane resin, cellulose resin, siloxane resin, polyimide resin, polyamide resin, and perylene resin.

A contact hole CNT_may be defined in the first touch insulating layer 215. The first touch conductive layer 210 (for example, the first connection unit CP1) and a part of the second touch conductive layer 220 (for example, the first sensor unit SP1) may be electrically connected to each other through the contact hole CNT_T.

When the first sensor unit SP1 and the second sensor unit SP2 each have a mesh pattern, the second touch conductive layer 220 constituting them may be disposed on the non-light emission area of the display panel. When the second touch conductive layer 220 is disposed in the non-light emission area, even when an opaque low-resistance metal is applied to the second touch conductive layer 220, light emission may not be disturbed, and the second touch conductive layer 220 may not be visually recognized by the user.

Figure 8:
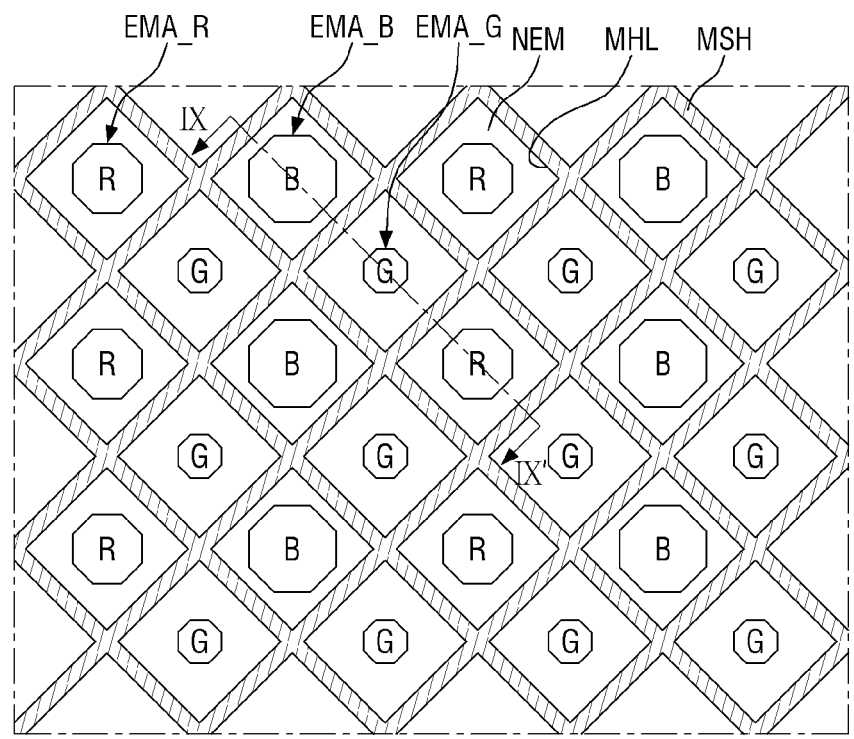
FIG. 8 is a plan view illustrating an embodiment of the arrangement relationship between pixels of a display area and a mesh pattern of a touch member.
Figure 8:
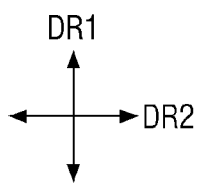

FIG. 8 is a plan view illustrating an embodiment of the arrangement relationship between pixels of a display area and a mesh pattern of a touch member.

Referring to FIG. 8, the display area includes a plurality of pixels. Each pixel includes a light emission area EMA. A non-light emission area NEM is disposed between the light emission areas EMA of each pixel. The mesh pattern MSH is disposed in the non-light emission area NEM.

The pixel may include a first color pixel, a second color pixel, and a third color pixel. The color pixels may be arranged in various ways. In an embodiment, first color pixels (for example, red pixels) and second color pixels (for example, blue pixels) may be alternately arranged to form a first row along the second direction DR2, and third pixels (for example, green pixels) may be arranged in a second row adjacent to the first row along the second direction DR2. The pixels belonging to the second row may be alternately arranged in the second direction DR2 with respect to the pixels belonging to the first row. The number of third color pixels belonging to the second row may be twice the number of first color pixels or second color pixels belonging to the first row. The arrangement of the first row and the second row may be repeated along the second direction DR2.

The sizes of the light emission areas EMA in the respective color pixels may be different from each other. In an embodiment, the light emission area EMA_B of the second color pixel may be larger than the light emission area EMA_R of the first color pixel, and the light emission area EMA_G of the third color pixel may be smaller than the light emission area EMA_R of the first color pixel, for example.

The shape of the light emission area EMA of each color pixel may be generally octagonal. However, the shape of each light emission area EMA may be a circle, a rhombus or other polygon, or a polygon having round corners, but is not limited thereto.

The mesh pattern MSH may be disposed along the boundary of the pixel in the non-light emission area NEM. The mesh pattern MSH may not overlap the light emission area EMA. The width of the mesh pattern MSH may smaller than the width of the non-light emission area NEM. In an embodiment, the mesh hole MHL exposed by the mesh pattern MSH may have a substantially rhombus shape. The sizes of the respective mesh holes MI-IL may be the same as each other, but may be different from each other depending on the size of the light emission area EMA exposed by the mesh hole MHL, or may be different from each other irrespective of the size thereof. Although it is illustrated in the drawing that one mesh hole MHL corresponds to one light emission area EMA, the invention is not limited thereto, and one mesh hole MEM may correspond to two or more light emission areas EMA.

Figure 9:
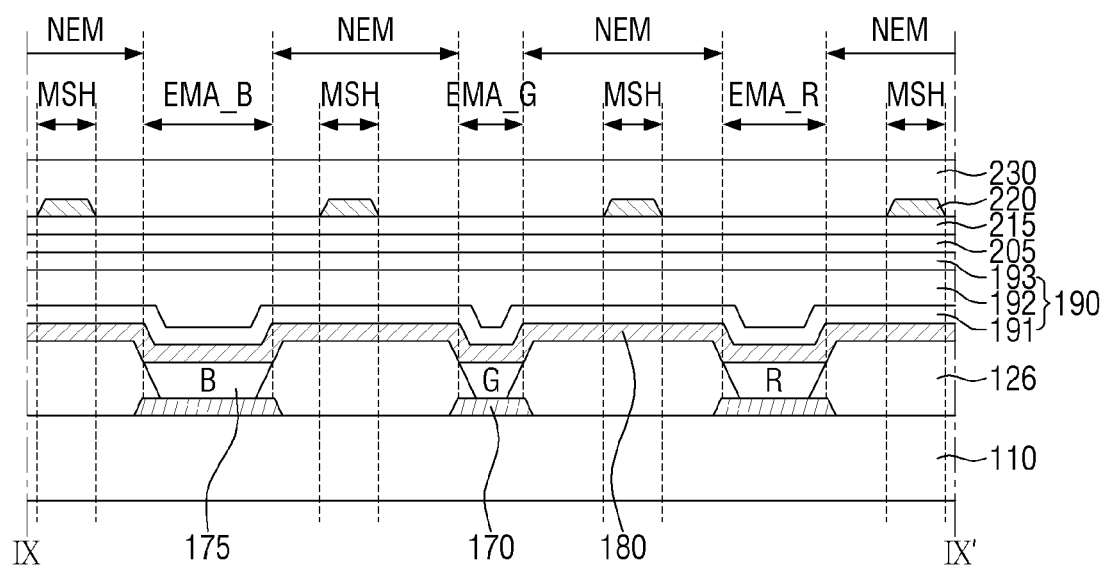
FIG. 9 is a cross-sectional view taken along line IX-IX' of FIG. 8.

FIG. 9 is a cross-sectional view taken along line IX-IX' of FIG. 8. In the cross-sectional view of FIG. 9, most of the layers under an anode electrode are omitted, and the upper structure of the organic light emitting element will be mainly illustrated.

Referring to FIG. 9, an anode electrode 170 is disposed on the substrate 110 for each pixel. A bank layer 126 exposing the anode electrode 170 may be disposed on the anode electrode 170. The bank layer 126 is disposed in the non-light emission area NEM.

An organic layer 175 may be disposed on the anode electrode 170 exposed by the bank layer 126, and a cathode electrode 180 may be disposed on the organic layer 175. The cathode electrode 180 may be disposed entirely without distinction of pixels. The anode electrode 170, the organic layer 175, and the cathode electrode 180 each constitute an organic light emitting element.

A thin film encapsulation layer 190 including a first inorganic layer 191, an organic layer 192, and a second inorganic layer 193 may be disposed on the cathode electrode 180, and the base layer 205, first touch insulating layer 215, second touch conductive layer 220, and second touch insulating layer 230 of the touch member may be sequentially disposed on the thin film encapsulation layer 190. Since FIG. 9 is a cross-sectional view of the sensor unit, the first touch conductive layer 210 is not illustrated in the corresponding cross-sectional view.

The second touch conductive layer 220 may be disposed to overlap the bank layer 126, and may be disposed in the non-light emission area NEM. Since the second touch conductive layer 220 constitutes the mesh pattern MSH of the sensor unit and does not overlap the light emission area, the second touch conductive layer 220 may not interfere with light emission, and may not be visually recognized by a user.

Hereinafter, a pixel of the display device will be described.

Figure 10:
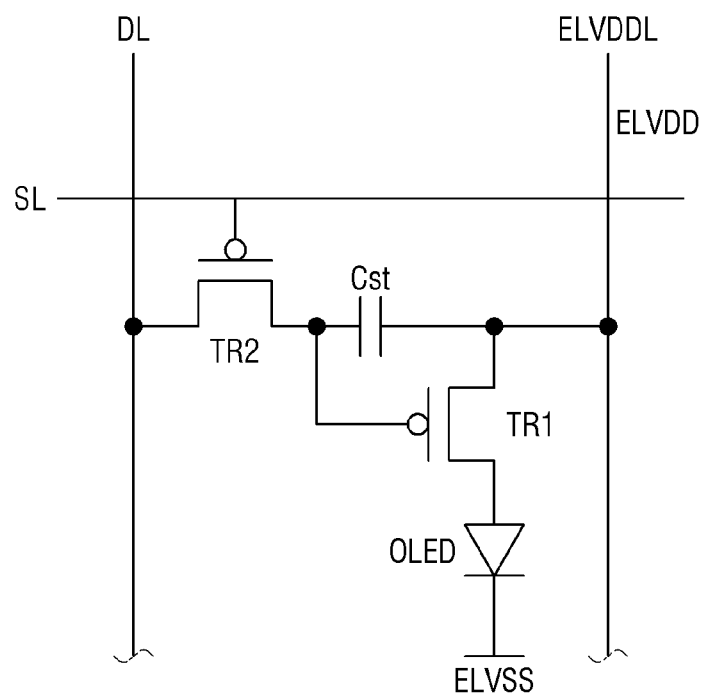
FIG. 10 is a circuit diagram of an embodiment of one pixel of a display device.

FIG. 10 is a circuit diagram of an embodiment of one pixel of a display device.

Referring to FIG. 10, the pixel circuit may include a first transistor TR1, a second transistor TR2, a capacitor Cst, and an organic light emitting diode OLED.

The first transistor TR1 may be a driving transistor, and the second transistor TR2 may be a switching transistor. Although it is illustrated in FIG. 10 that both the first transistor TR1 and the second transistor TR2 may be p-channel metal-oxide-semiconductor ("PMOS") transistors, any one of the first transistor TR1 and the second transistor TR2 or both of them may be n-channel metal-oxide-semiconductor ("NMOS") transistors.

A first electrode (source electrode) of the first transistor TR1 is connected to a first power line ELVDDL, and a second electrode (drain electrode) thereof is connected to an anode electrode of the organic light emitting diode OLED. A first electrode (source electrode) of the second transistor TR2 is connected to a data line DL, and a second electrode (drain electrode) thereof is connected to a gate electrode of the first transistor TR1. The capacitor Cst is connected between the gate electrode and first electrode of the first transistor TR1. A cathode electrode of the organic light emitting diode OLED receives a second power voltage ELVSS. The second power voltage ELVSS may be a voltage lower than the first power voltage ELVDD provided from the first power line ELVDDL.

The second transistor TR2 may output a data signal applied to the data line DL in response to a scan signal applied to a scan line SL. The capacitor Cst may charge a voltage corresponding to the data signal received from the second transistor TR2. The first transistor TR1 may control a driving current flowing through the organic light emitting diode OLED in response to the amount of charge stored in the capacitor Cst.

The equivalent circuit of FIG. 10 is only an embodiment, and the pixel circuit may include a larger number (for example, seven) of transistors and capacitors.

Figure 11:
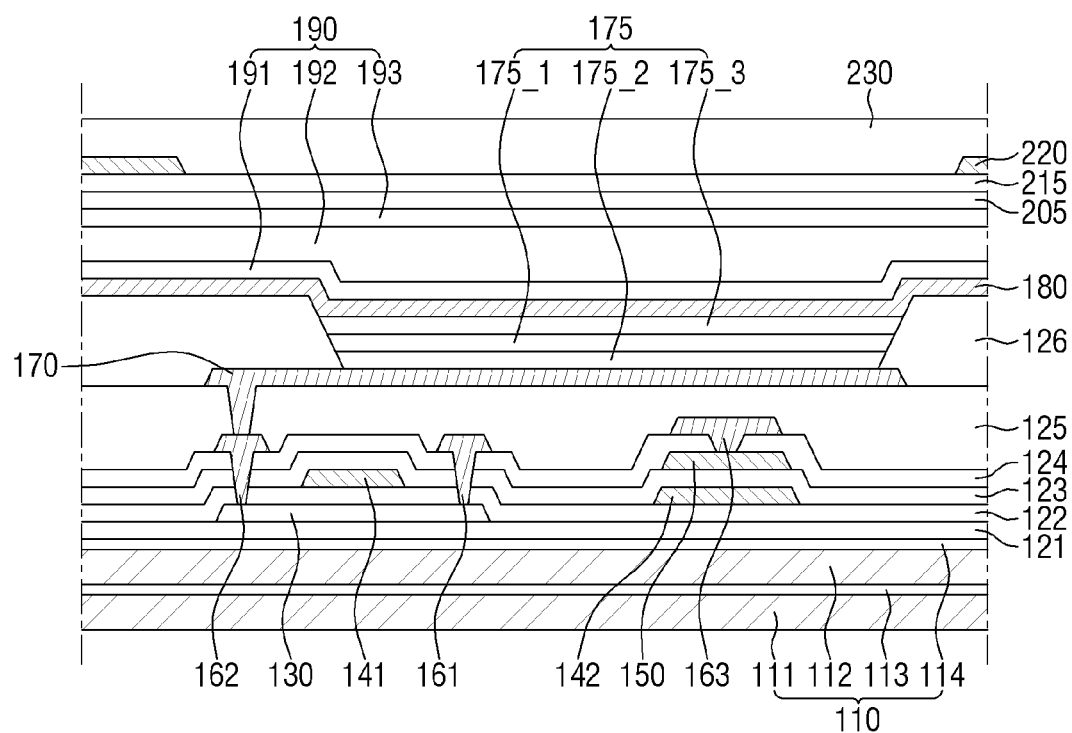
FIG. 11 is a cross-sectional view of an embodiment of one pixel of a display area of a display device.

FIG. 11 is a cross-sectional view of an embodiment of one pixel of a display area of a display device. A cross-sectional structure of the display device will be described in detail with reference to FIG. 11.

Referring to FIG. 11, the display device includes a substrate 110. The substrate 110 supports each of the layers disposed thereon. The substrate 110 may include an insulating material such as a polymer resin. Examples of the polymer resin may include polyethersulphone ("PES"), polyacrylate ("PA"), polyarylate ("PAR"), polyetherimide ("PEI"), polyethylene napthalate ("PEN"), polyethylene terepthalate ("PET"), polyphenylene sulfide ("PPS"), polyallylate, polyimide ("PI"), polycarbonate, cellulose triacetate ("CAT"), cellulose acetate propionate ("CAP"), and combinations thereof.

In an embodiment, the substrate 110 may include a plurality of sub-substrates 111 and 112. In an embodiment, the substrate 110 may include a first sub-substrate 111 and a second sub-substrate 112 stacked in the thickness direction, for example. Each of the first sub-substrate 111 and the second sub-substrate 112 may be a flexible substrate including polyimide or the like. The substrate 110 may further include a first barrier layer 113 disposed between the first sub-substrate 111 and the second sub-substrate 112 and a second barrier layer 114 disposed on the second sub-substrate 112. The first barrier layer 113 and the second barrier layer 114 may each include silicon nitride, silicon oxide, or silicon oxynitride.

A buffer layer 121 is disposed on the substrate 110. The buffer layer 121 may be disposed on the second barrier layer 114. The buffer layer 121 may include silicon nitride, silicon oxide, or silicon oxynitride.

A semiconductor layer 130 is disposed on the buffer layer 121. The semiconductor layer 130 forms a channel of a TFT of a pixel. The semiconductor layer 130 may include polycrystalline silicon. In another embodiment, the semiconductor layer 130 may include single crystal silicon, low-temperature polycrystalline silicon, amorphous silicon, or oxide semiconductor. In an embodiment, the oxide semiconductor may include, for example, a two-component compound (ABx), a three-component compound (ABxCy), and a four-component compound (ABxCyDz) each selectively including indium, zinc, gallium, tin, titanium, aluminum, hafnium (Hf), zirconium (Zr), and magnesium (Mg). In an embodiment, the semiconductor layer 130 may include ITZO (or an oxide including indium, tin, and titanium) or indium gallium zinc oxide ("IGZO") (or an oxide including indium, gallium, and tin).

A first insulating layer 122 is disposed on the semiconductor layer 130. The first insulating layer 122 may be a gate insulating layer having a gate insulating function. The first insulating layer 122 may include a silicon compound, or a metal oxide. In an embodiment, the first insulating layer 122 may include silicon oxide, silicon nitride, silicon oxynitride, aluminum oxide, tantalum oxide, hafnium oxide, zirconium oxide, or titanium oxide, for example. These oxides may be used alone or in combination with each other. The first insulating layer 122 may be a single layer or multiple layers including a stacked layer of different materials.

A first gate conductive layer 140 is disposed on the first insulating layer 122. The first gate conductive layer 140 may include a gate electrode 141 of a TFT, a scan line connected thereto, and a capacitor first electrode 142.

In an embodiment, the first gate conductive layer 140 may include at least one metal including at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

A second insulating layer 123 may be disposed on the first gate conductive layer 140. The second insulating layer 123 may be an interlayer insulating layer. In an embodiment, the second insulating layer 123 may include an inorganic insulating material such as silicon oxide, silicon nitride, silicon oxynitride, hafnium oxide, aluminum oxide, titanium oxide, tantalum oxide, or zinc oxide.

A second gate conductive layer 150 is disposed on the second insulating layer 123. The second gate conductive layer 150 may include a storage capacitor second electrode 150. The second gate conductive layer 150 itself may be the storage capacitor second electrode 150, and is given the same reference numeral with substantially the same component.

In an embodiment, like the first gate conductive layer 140, the second gate conductive layer 150 may include at least one metal including at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second gate conductive layer 150 may include the same material as that of the first gate conductive layer 140, but the invention is not limited thereto. The second gate conductive layer 150 may be a single layer or multiple layers.

A third insulating layer 124 is disposed on the second gate conductive layer 150. The third insulating layer 124 may be an interlayer insulating layer. In an embodiment, the third insulating layer 124 may include an inorganic insulating material such as silicon oxide, silicon nitride, silicon oxynitride, hafnium oxide, aluminum oxide, titanium oxide, tantalum oxide, or zinc oxide, or may include an organic insulating material such as acrylic resin, epoxy resin, phenolic resin, polyamide resin, polyimide resin, unsaturated polyester resin, polyphenylene ether resin, polyphenylene sulfide resin, or benzocyclobutene ("BCB"). The third insulating layer 124 may be a single layer or multiple layers including a stacked layer of different materials.

A data conductive layer 160 is disposed on the third insulating layer 124. The data conductive layer 160 may include a first electrode 161, a second electrode 162, and a first power line 163 of a TFT. The first electrode 161 and second electrode 162 of the TFT may be electrically connected to the source region and drain region of the semiconductor layer 130 through a contact hole penetrating the third insulating layer 124, the second insulating layer 123, and the first insulating layer 122. The first power line 163 may be electrically connected to the storage capacitor second electrode 150 through a contact hole penetrating the third insulating layer 124.

In an embodiment, the data conductive layer 160 may include at least one metal including at least one of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The data conductive layer 160 may be a single layer or multiple layers. In an embodiment, the data conductive layer 160 may be provided in a stacked structure of Ti/Al/Ti, Mo/Al/Mo, Mo/AlGe/Mo, or Ti/Cu, for example.

A fourth insulating layer 125 is disposed on the data conductive layer 160. The fourth insulating layer 125 covers the data conductive layer 160. The fourth insulating layer 125 may be a via layer. In an embodiment, the fourth insulating layer 125 may include an organic insulating material such as acrylic resin, epoxy resin, phenolic resin, polyamide resin, polyimide resin, unsaturated polyester resin, polyphenylene ether resin, polyphenylene sulfide resin, or BCB.

An anode electrode 170 is disposed on the fourth insulating layer 125. The anode electrode 170 may be connected to the second electrode 162 of the TFT through a contact hole penetrating the fourth insulating layer 125.

In an embodiment, the anode electrode 170 may have a stacked film structure in which a high-work-function material layer including indium-tin-oxide ("ITO"), indium-zinc-oxide ("IZO"), zinc oxide (ZnO), or indium oxide ($In_2O_3$) and a reflective material layer including silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca), or a combination thereof. The high-work-function material layer may be disposed above the reflective material layer, and disposed closer to the organic layer. In an embodiment, the anode electrode 170 may have a multi-layer structure of ITO/Mg, ITO/MgF, ITO/Ag, or ITO/Ag/ITO, but the invention is not limited thereto.

A bank layer 126 may be disposed on the anode electrode 170. An opening exposing the anode electrode may be defined in the bank layer 126. In an embodiment, the bank layer 126 may include an organic insulating material such as acrylic resin, epoxy resin, phenolic resin, polyamide resin, polyimide resin, unsaturated polyester resin, polyphenylene ether resin, polyphenylene sulfide resin, or BCB. The bank layer 126 may also include an inorganic material.

An organic layer 175 is disposed in the opening of the bank layer 126. The organic layer 175 may include an organic light emitting layer 175_1, a hole injection/transport layer 175_2, and an electron injection/transport layer 175_3. In the drawing, a case where the hole injection/transport layer 175_2 and the electron injection/transport layer 175_3 include one layer is illustrated, but a plurality of layers of the injection layer and a plurality of layers of the transport layer may be stacked, respectively.

A cathode electrode 180 is disposed on the organic layer 175 and the bank layer 126. The cathode electrode 180 may be disposed over the entire display area DDA. In an embodiment, the cathode electrode 180 may include a low-work-function material layer including Li, Ca, LiF/Ca, LiF/Al, Al, Mg, Ag, Pt, Pd, Ni, Au Nd, Ir, Cr, BaF, Ba, or a compound or combination thereof (for example, a combination of Ag and Mg). The cathode electrode 180 may further include a transparent metal oxide layer disposed on the low-work-function material layer.

A thin film encapsulation layer 190 is disposed on the cathode electrode 180. The thin film encapsulation layer 190 may include a first inorganic layer 191, an organic layer 192, and a second inorganic layer 193. In an embodiment, the first inorganic layer 191 and the second inorganic layer 193 may each include silicon nitride, silicon oxide, or silicon oxynitride. The organic layer 192 may include an organic insulating material such as acrylic resin, epoxy resin, phenolic resin, polyamide resin, polyimide resin, unsaturated polyester resin, polyphenylene ether resin, polyphenylene sulfide resin, or BCB.

A touch member is disposed on the thin film encapsulation layer 190. Since the stacked structure of the touch member has been described above, a redundant description will be omitted.

Hereinafter, signal lines around the bending area BR of the display device will be described in detail.

Figure 12:
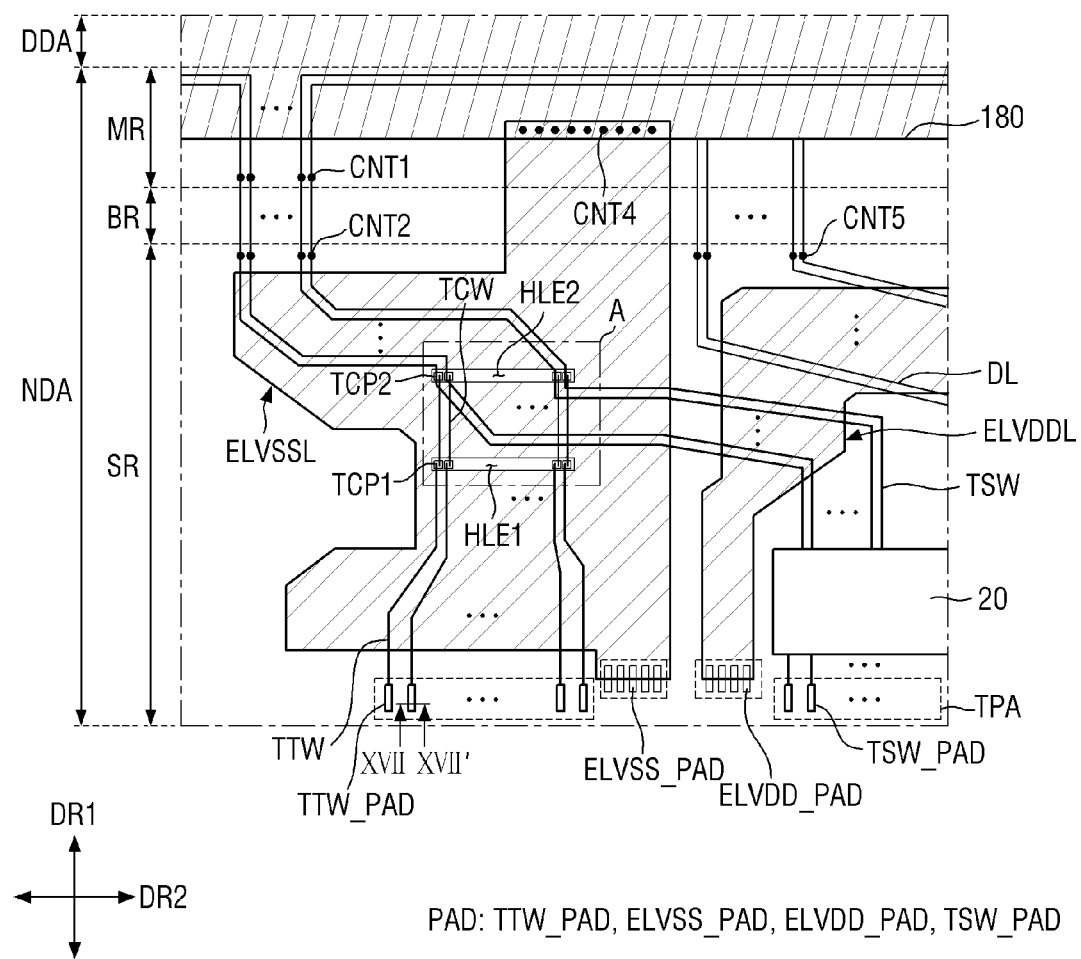
FIG. 12 is a partial plan view of an embodiment of a non-display area of a display device.

FIG. 12 is a partial plan view of an embodiment of a non-display area of a display device.

Referring to FIG. 12, the touch signal line TSW may be disposed adjacent to the first power line ELVDDL and the second power line ELVSSL. The touch signal line TSW may include at least one of the touch driving line TX (refer to FIG. 4) and the touch sensing line RX (refer to FIG. 4). The data line DL may be disposed adjacent to the first power line ELVDDL and the second power line ELVSSL.

In an embodiment, in the signal lines in the sub-area SR, the touch signal line TSW, the second power line ELVSSL, the data line DL, and the first power line ELVDDL may be arranged in this order along the second direction DR2.

The touch signal line TSW may include a conductive layer different from the second power line ELVSSL, the data line DL, and the first power line ELVDDL. Although not limited thereto, for example, in the sub-area SR, the touch signal line TSW may include a touch conductive layer, the first power line ELVDDL and the second power line ELVSSL may include a data conductive layer, and the data line DL may include a gate conductive layer.

The touch signal line TSW may overlap each of the first power line ELVDDL and the second power line ELVSSL. The touch signal line TSW may extend over the first power line ELVDDL and the second power line ELVSSL, and one end thereof may be physically and/or electrically connected to the driving chip 20.

The display device 1 may further include a touch test line TTW and a touch connection line TCW. The touch test line TTW and the touch connection line TCW may be disposed in the sub-area SR. Each of the touch test line TTW and the touch connection line TCW may partially overlap the second power line ELVSSL in the thickness direction. The touch test line TTW may be disposed in the same layer as the touch signal line TSW and may be separated and spaced apart from the touch signal line TSW. The touch test line TTW may be disposed at the other side of the touch signal line TSW in the first direction DR1.

In the sub-area SR, the touch test line TTW may include the same conductive layer as the touch signal line TSW. Although not limited thereto, for example, the touch signal line TSW may include a touch conductive layer, and in this case, the touch test line TTW may include a touch conductive layer.

The touch connection line TCW may include a different conductive layer from the touch test line TTW and the touch signal line TSW. In an embodiment, the touch connection line TCW may include the first gate conductive layer 140 (refer to FIG. 11), for example, but the invention is not limited thereto. The touch connection line TCW may overlap the second power line ELVSSL in the thickness direction and may overlap the touch signal line TSW in the thickness direction. The touch connection line TCW may intersect the touch signal line TSW in a plan view.

At least one of a characteristic test and an aging test of the touch member may be performed through the touch test line TTW. The characteristic test and aging test of the touch member may be performed using a separate test jig (not shown). A test point (not shown) directly contacting the test jig (not shown) may be disposed on the driving substrate 30, and may be electrically connected to the touch test line TTW through a touch test line pad area TTW_PAD. The touch test line TTW may be electrically connected to the touch signal line TSW through the touch connection line TCW.

Figure 13:
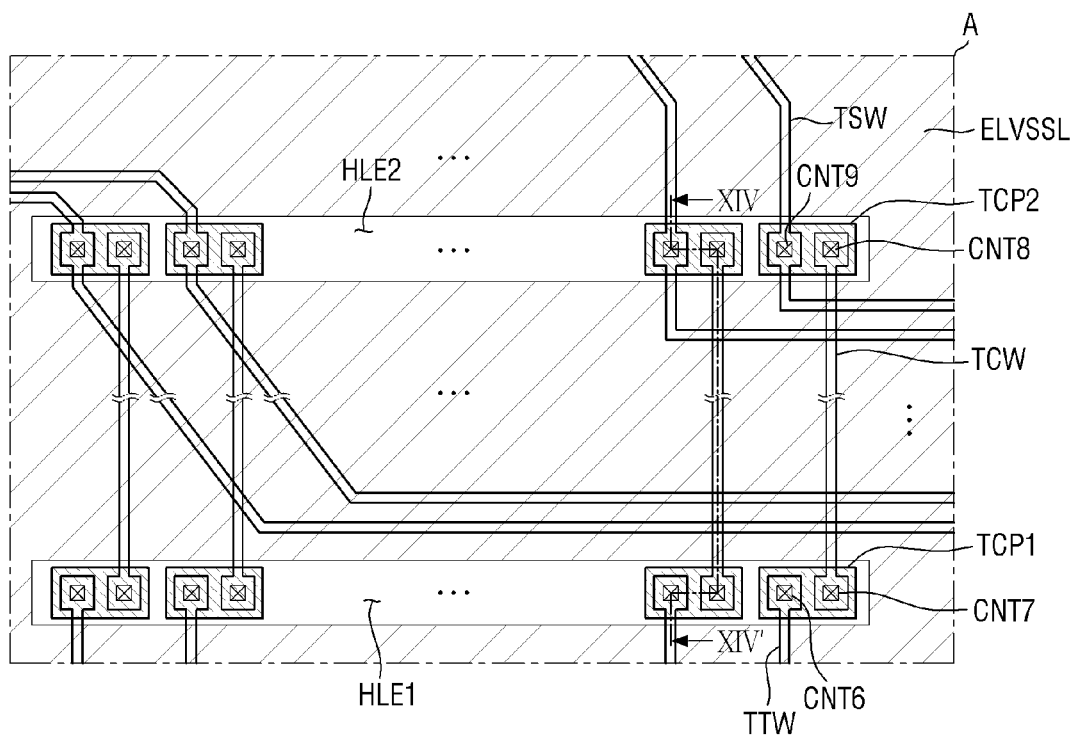
FIG. 13 is an enlarged view of the area A of FIG. 12.
Figure 14:
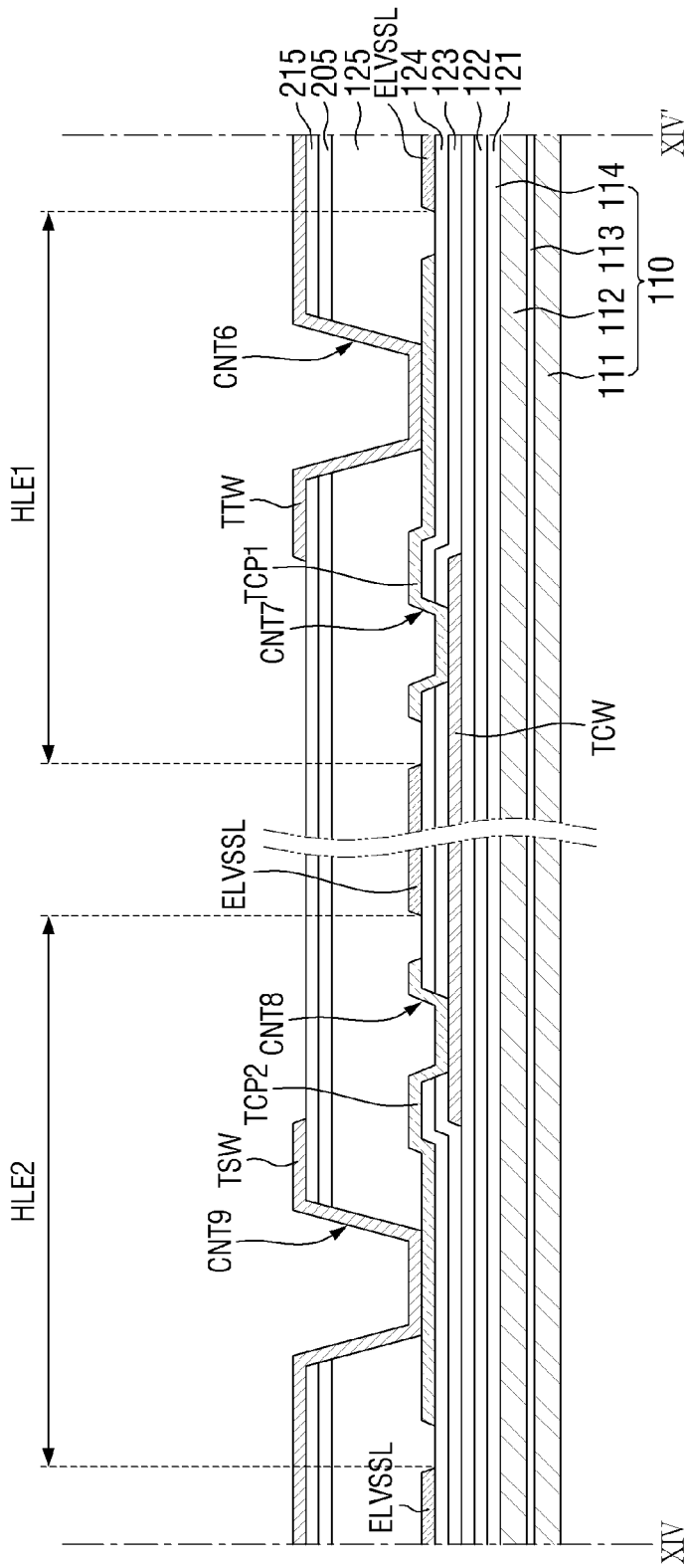
FIG. 14 is a cross-sectional view taken along line XIV-XIV' of FIG. 13.

FIGS. 13 and 14 are further referred to in order to explain a connection relationship of the touch signal line TSW, the touch test line TTW, and the touch connection line TCW.

FIG. 13 is an enlarged view of the area A of FIG. 12. FIG. 14 is a cross-sectional view taken along line XIV-XIV' of FIG. 13.

Referring to FIGS. 13 and 14, the touch test line TTW and the touch signal line TSW separated from each other may be electrically connected to each other through the touch connection line TCW.

Specifically, the touch test line TTW and the touch signal line TSW may be separated and spaced apart from each other without intersecting each other, and the touch connection line TCW may be disposed between the touch test line TTW and the touch signal line TSW in a plan view. In a plan view, the touch connection line TCW may intersect the touch signal line TSW, and at least a part thereof may overlap the touch signal line TSW in the thickness direction. However, the invention is not limited thereto, and the touch connection line TCW may intersect the touch test line TTW and may overlap the touch test line TTW.

The display device 1 may further include a first touch connection pattern TCP1 and a second touch connection pattern TCP2. The first touch connection pattern TCP1 and the second touch connection pattern TCP2 may be provided in the same layer as the second power line ELVSSL, and may include the same conductive layer. In an embodiment, when the second power line ELVSSL includes the data conductive layer 160 (refer to FIG. 11), the first touch connection pattern TCP1 and the second touch connection pattern TCP2 may include the data conductive layer 160 (refer to FIG. 11), for example.

A plurality of first touch connection patterns TCP1 and a plurality of second touch connection patterns TCP2 may be provided. The plurality of first touch connection patterns TCP1 may have an island shape, may be separated and spaced apart from each other, and may be electrically insulated from each other. The plurality of second touch connection patterns TCP2 may have an island shape, may be separated and spaced apart from each other, and may be electrically insulated from each other. The plurality of first touch connection patterns TCP1 and the plurality of second touch connection patterns TCP2 may be arranged in the second direction DR2, respectively. The plurality of first touch connection patterns TCP1 arranged in the second direction DR2 may be disposed at the other side of the plurality of second touch connection patterns TCP2 arranged in the second direction DR2 in the first direction DR1, but the invention is not limited thereto.

In each of the plurality of first touch connection patterns TCP1 and the plurality of second touch connection patterns TCP2, at least one of one side and the other side in the first direction DR1 and one side and the other side in the second direction DR2 may be covered by the second power line ELVSSL in a plan view.

In an embodiment, each of the plurality of first touch connection patterns TCP1 and the plurality of second touch connection patterns TCP2 may be surrounded by the second power line ELVSSL in a plan view, for example. In other words, the second power line ELVSSL may define a first through hole HLE1 and a second through hole HLE2 penetrating in the thickness direction. The plurality of first touch connection patterns TCP1 may be disposed in the first through hole HLE1 and may be surrounded by the second power line ELVSSL in a plan view. The plurality of second touch connection patterns TCP2 may be disposed in the second through hole HLE2 and may be surrounded by the second power line ELVSSL in a plan view. That is, in each of the plurality of first touch connection patterns TCP1 and the plurality of second touch connection patterns TCP2, one side and the other side in the first direction DR1 and one side and the other side in the second direction DR2 may be covered by the second power line ELVSSL in a plan view.

However, the invention is not limited thereto, and the second power line ELVSSL may have a structure curved at one side or the other side in the second direction DR2, or may have a structure curved at one side or the other side in the first direction DR1. The plurality of first touch connection patterns TCP1 and the plurality of second touch connection patterns TCP2 may be disposed on the curved portion of the second power line ELVSSL, respectively.

The touch test line TTW may be electrically connected to the touch connection line TCW by the first touch connection pattern TCP1. The touch connection line TCW may be electrically connected to the touch signal line TSW by the second touch connection pattern TCP2.

Specifically, the touch test line TTW may overlap the first touch connection pattern TCP1, and may be in contact with the first touch connection pattern TCP1 through a sixth contact hole CNT6 penetrating the first touch insulating layer 215, the base layer 205, and the fourth insulating layer 125 in the overlap area to expose at least a part of the first touch connection pattern TCP1. In other words, the touch test line TTW may be physically and/or electrically connected to the first touch connection pattern TCP1 through the sixth contact hole CNT6.

The first touch connection pattern TCP1 may overlap the touch connection line TCW, and may be in contact with the touch connection line TCW through a seventh contact hole CNT7 penetrating the third insulating layer 124 and the second insulating layer 123 in the overlap area to expose at least a part of the touch connection line TCW. In other words, the first touch connection pattern TCP1 may be physically and/or electrically connected to the touch connection line TCW through the seventh contact hole CNT7. Accordingly, the touch test line TTW is electrically connected to the touch connection line TCW through the first touch connection pattern TCP1.

The touch signal line TSW may overlap the second touch connection pattern TCP2, and may be in contact with the second touch connection pattern TCP2 through a ninth contact hole CNT9 penetrating the first touch insulating layer 215, the base layer 205, and the fourth insulating layer 125 in the overlap area to expose at least a part of the second touch connection pattern TCP2. In other words, the touch signal line TSW may be physically and/or electrically connected to the second touch connection pattern TCP2 through the ninth contact hole CNT9.

The touch signal line TSW may overlap the second touch connection pattern TCP2 at an intermediate point of the touch signal line TSW. In other words, the touch signal line TSW may overlap the second touch connection pattern TCP2 at an intermediate point extending from the driving chip 20 toward the main area MR, and may be in contact with the second touch connection pattern TCP2 through the ninth contact hole CNT9. Even when the touch signal line TSW passes through the ninth contact hole CNT9, the touch signal line TSW may continuously extend from the driving chip 20 to the touch member of the main area MR. However, the invention is not limited thereto.

The second touch connection pattern TCP2 may overlap the touch connection line TCW, and may be in contact with the touch connection line TCW through an eighth contact hole CNT8 penetrating the third insulating layer 124 and the second insulating layer 123 in the overlap area to expose at least a part of the touch connection line TCW. In other words, the second touch connection pattern TCP2 may be physically and/or electrically connected to the touch connection line TCW through the eighth contact hole CNT8. Accordingly, the touch signal line TSW is electrically connected to the touch connection line TCW through the second touch connection pattern TCP2.

Therefore, even when the touch test line TTW and the touch signal line TSW are arranged on the same layer, separated and spaced apart from each other, and do not intersect each other, the touch test line TTW may be electrically connected to the touch signal line TSW through the touch connection line TCW.

When the driving chip 20 transmits a display driving signal and a driving signal of the touch member together, the touch signal line TSW is electrically connected to the driving chip 20. Accordingly, the touch test line TTW for testing the touch member may be provided separately from the touch signal line TSW. Even when the touch signal line TSW and the touch test line TTW provided separately are disposed in the same layer as the touch signal line TSW and are separated from each other, the touch test line TTW may be electrically connected to the touch signal line TSW by the touch connection line TCW disposed in a different layer from the touch test line TTW and the touch signal line TSW.

As the touch test line TTW is electrically connected to the touch signal line TSW by the touch connection line TCW, the touch test line TTW may not be disposed between the plurality of touch signal lines TSW, and a coupling or short failure that may occur between the touch test line TTW and the touch signal line TSW may be suppressed or prevented. Moreover, the reliability of the touch member and the display device 1 may be improved. In addition, even when the touch signal line TSW is connected to the driving chip 20, the touch test line TTW may be separately disposed, so that it is possible to test the characteristics and aging of the touch member. Accordingly, the reliability of the touch member and the display device 1 may be further improved.

Referring back to FIG. 12, the display device 1 may further include a pad area PAD. The pad area PAD includes a touch test line pad area TTW_PAD, a first power line pad area ELVDD_PAD, a second power line pad area ELVSS_PAD, and a touch signal line pad area TSW_PAD. The first power line pad area ELVDD_PAD and the second power line pad area ELVSS_PAD may be disposed adjacent to each other, and the second power line pad area ELVSS_PAD may be disposed at one side of the first power line pad area ELVDD_PAD in the second direction DR2. Each line may be electrically connected to the driving substrate 30 through the pad area PAD.

The touch signal line pad area TSW_PAD may be disposed at one side of the first power line pad area ELVDD_PAD and the second power line pad area ELVSS_PAD in the second direction DR2. The touch test line pad area TTW_PAD may be disposed at the other side of the first power line pad area ELVDD_PAD and the second power line pad area ELVSS_PAD in the second direction DR2. The touch signal line pad area TSW_PAD may be disposed inside the touch pad area TPA, and the touch test line pad area TTW_PAD may be disposed outside the touch pad area TPA. Although not shown, a data line pad area (not shown) may be disposed at one side of the first power line pad area ELVDD_PAD in the second direction DR2.

The first power line ELVDDL and the second power line ELVSSL may include the same conductive layer, for example, the data conductive layer 160 (refer to FIG. 11). The second power line ELVSSL may extend over the sub-area SR, the bending area BR, and the main area MR by the data conductive layer 160 (refer to FIG. 11). Although not shown, the first power line ELVDDL may also extend over the sub-area SR, the bending area BR, and the main area MR by the data conductive layer 160 (refer to FIG. 11). Since the first power line ELVDDL and the second power line ELVSSL include the same conductive layer, they may be separated from each other without contacting each other.

The cathode electrode 180 disposed on the display area DDA may partially protrude toward the non-display area NDA to overlap the second power line ELVSSL. In an area where the second power line ELVSSL overlaps the cathode electrode 180, the second power line ELVSSL may be in contact with the cathode electrode through a fourth contact CNT4. The fourth contact CNT4 may be performed through a contact hole, but the invention is not limited thereto. In an embodiment, the contact between the second power line ELVSSL and the cathode electrode 180 may be mediated by the anode conductive layer 170 (refer to FIG. 11) disposed in the same layer as the anode electrode.

The data line DL may extend from the driving chip 20 to one side in the first direction DR1. The data line DL may include at least one of the first and second gate conductive layers 140 and 150 (refer to FIG. 11). In an embodiment, the data line DL may include the second gate conductive layer 150 (refer to FIG. 11), but the invention is not limited thereto, for example.

The data line DL extends from the driving chip 20 to the display area DDA via the bending area BR, and may be transferred to another conductive layer through the fifth contact CNT5 before traversing the bending area BR. In an embodiment, at the other side of the bending area BR in the first direction DR1, the data line DL may be transferred to the data conductive layer 160 (refer to FIG. 11) through the fifth contact CNT5, and may be electrically connected to each pixel of the display area DDA through the bending area BR, for example. The fifth contact CNT5 may be performed through a contact hole, but the invention is not limited thereto.

The touch signal line TSW extends from the driving chip 20 toward the main area MR. The driving chip 20 may be electrically connected to the touch signal line pad area TSW_PAD. Immediately before entering the non-display area NDA in the main area MR, the touch signal line TSW may be bent and extended in the second direction DR2.

The touch signal line TSW includes a touch conductive layer in the sub-area SR and the main area MR, but may include the data conductive layer 160 (refer to FIG. 11), which is the same layer as the first power line ELVDDL and the second power line ELVSSL, in the bending area BR. Details thereof will be described with reference to FIGS. 15 and 16.

Figure 15:
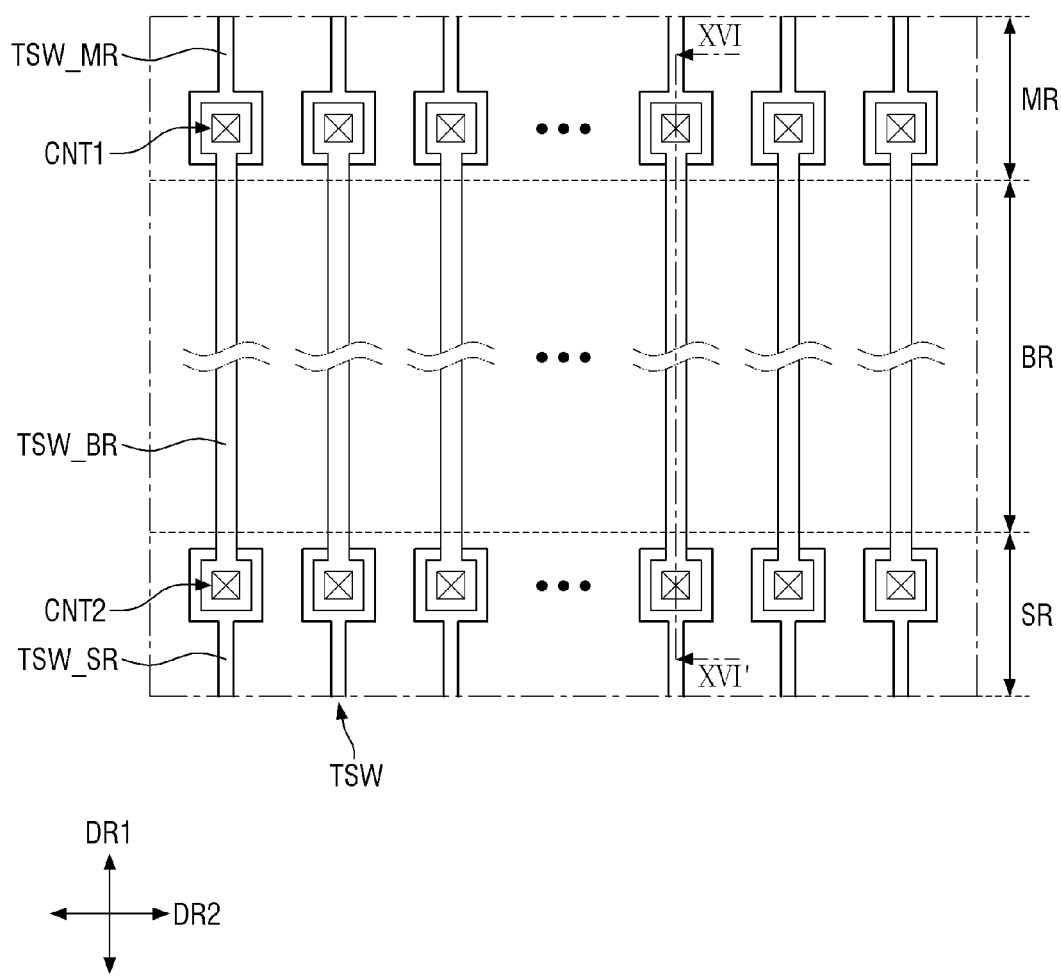
FIG. 15 is a plan view of touch signal lines around a bending area.
Figure 16:
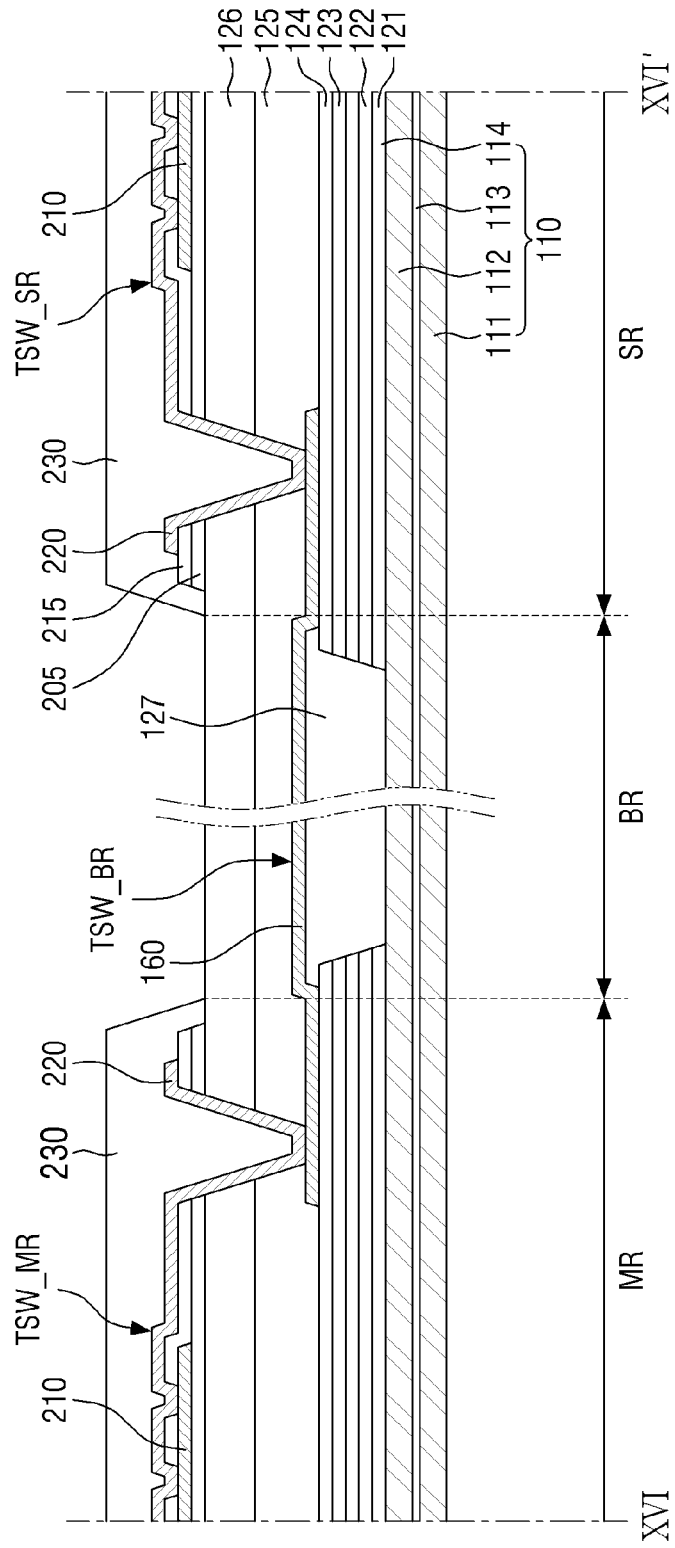
FIG. 16 is a cross-sectional view taken along line XVI-XVI' of FIG. 15.

FIG. 15 is a plan view of touch signal lines around a bending area. FIG. 16 is a cross-sectional view taken along line XVI-XVI' of FIG. 15.

Referring to FIGS. 15 and 16, the touch signal line TSW includes a first touch conductive layer 210 and a second touch conductive layer 220 in the sub-area SR and the main area MR, respectively. The first touch conductive layer 210 and the second touch conductive layer 220 have substantially the same planar pattern shape and may overlap each other. The first touch conductive layer 210 and the second touch conductive layer 220 may be electrically connected to each other through contact holes CNT1 and CNT2 penetrating the first touch insulating layer 215.

An opening may be defined in the bending area BR including a bending insulating layer 127 disposed in the opening. The opening may expose the surface of the second sub-substrate 112 by sequentially removing the underlying insulating material layers. The bending insulating layer 127 may fill the opening. The bending insulating layer 127 may include an organic insulating material such as acrylic resin, epoxy resin, phenolic resin, polyamide resin, polyimide resin, unsaturated polyester resin, polyphenylene ether resin, polyphenylene sulfide resin, or BCB.

The touch signal line TSW (e.g., TSW_BR) extends through the data conductive layer 160 (refer to FIG. 11) in the bending area BR. That is, the touch signal line TSW (e.g., TSW_MR) of the main area MR and the touch signal line TSW (e.g., TSW SR) of the sub-area SR include a touch conductive layer, but include the data conductive layer 160 in the vicinity of the bending area BR.

Specifically, the base layer 205 may be disposed on the bank layer 126 with the thin film encapsulation layer removed from the main area MR adjacent to the bending area BR. The touch signal line TSW includes a first touch conductive layer 210 on the base layer 205 and a second touch conductive layer 220 electrically connected to the first touch conductive layer 210 through the first contact hole CNT1. The second touch conductive layer 220 further extends from the end of the first touch conductive layer 210 toward the bending area BR to overlap the underlying data conductive layer 160. The second touch conductive layer 220 is electrically connected to the data conductive layer 160 through a first contact. A second touch insulating layer 230 is disposed on the second touch conductive layer 220.

The sub-area SR may also have a stacked structure that is substantially the same as that of the main area MR. That is, the second touch conductive layer 220 of the sub-area SR further extends from the end of the first touch conductive layer 210 toward the bending area BR to overlap the underlying data conductive layer 160, and is electrically connected to the data conductive layer 160 through the second contact hole CNT2.

In the case of the bending area BR, the data conductive layer 160 is disposed on the bending insulating layer 127. A fourth insulating layer 125 and a bank layer 126, which include an organic material, may be disposed on the data conductive layer 160. The first and second touch conductive layers 210 and 220 may not be disposed on the bank layer 126 of the bending area BR. In the bending area BR, other layers constituting the touch member may be omitted.

Like this, the touch signal line TSW generally includes the second touch conductive layer 220 and/or the first touch conductive layer 210 in the main area MR and the sub-area SR, but may include the data conductive layer 160 in the bending area like other signal lines. Accordingly, a uniform bending connection structure may be implemented over the entire bending area BR.

Figure 17:
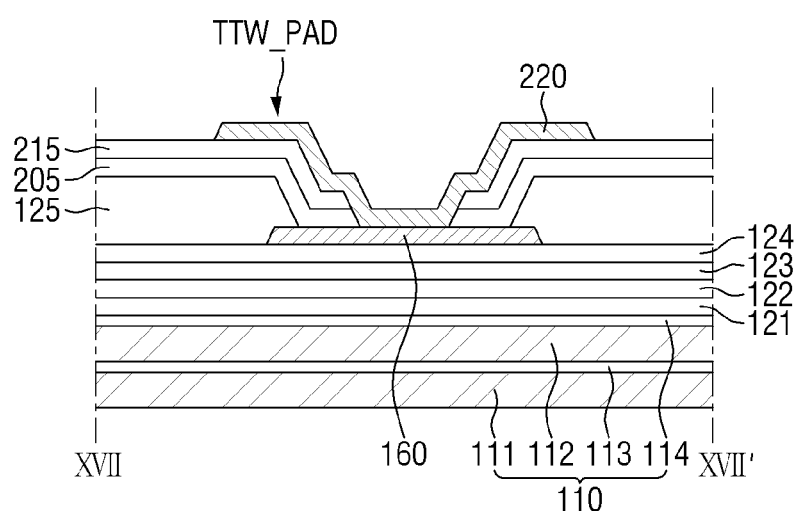
FIG. 17 is a cross-sectional view taken along line XVII-XVII' of FIG. 12.

FIG. 17 is a cross-sectional view taken along line XVII-XVII' of FIG. 12.

Referring to FIG. 17, when the touch test line TTW extends to the touch test line pad area TTW_PAD, in the touch test line pad area TTW_PAD, the second touch conductive layer 220 is connected to the data conductive layer 160 through a contact. In the touch test line pad area TTW_PAD, the second touch insulating layer 230 (refer to FIG. 16) is removed to expose the second touch conductive layer 220. A bump of the driving substrate 30 (refer to FIG. 1) may be attached onto the exposed second touch conductive layer 220. In the vicinity of the touch test line pad area TTW_PAD, the bank layer may also be omitted.

Although not shown, the pad area PAD of other signal lines (first power line ELVDDL, second power line ELVSSL, touch signal line TSW, and data line DL) may also have the same structure as the touch test line pad area TTW_PAD. In an embodiment, in the case of the first power line ELVDDL, the first power line ELVDDL extends from the sub-area SR to the data conductive layer 160 but reaches the first power line pad area ELVDD_PAD and forms the second touch conductive layer 220 connected through a contact on the first power line pad area ELVDD_PAD, thereby having a cross-sectional structure shown in FIG. 17, for example. As described above, since the pad areas PAD have the same stacked structure, attachment of the driving substrate 30 (refer to FIG. 1) may be made easier.

Hereinafter, other embodiments will be described. In the following embodiments, for the same components as those previously described, redundant descriptions will be omitted or simplified, and differences will be mainly described.

Figure 18:
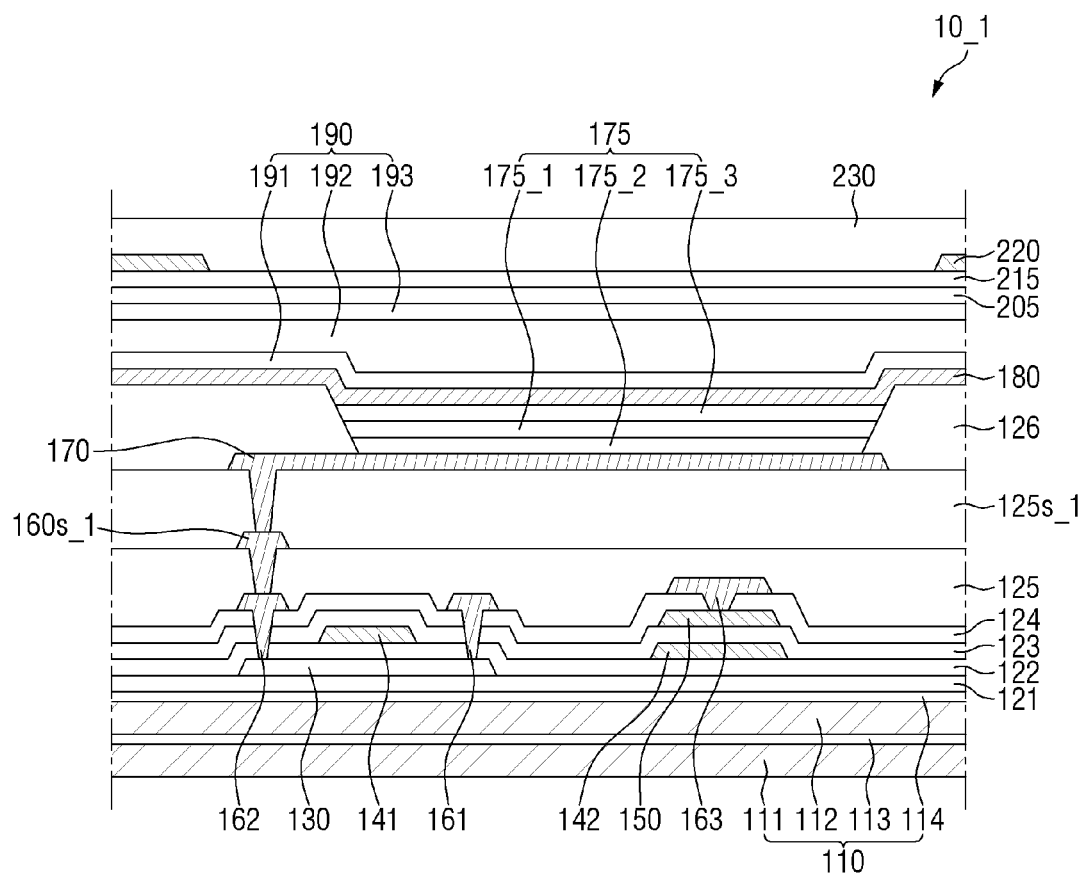
FIG. 18 is a cross-sectional view of another embodiment of one pixel of a display area of a display device.
Figure 19:
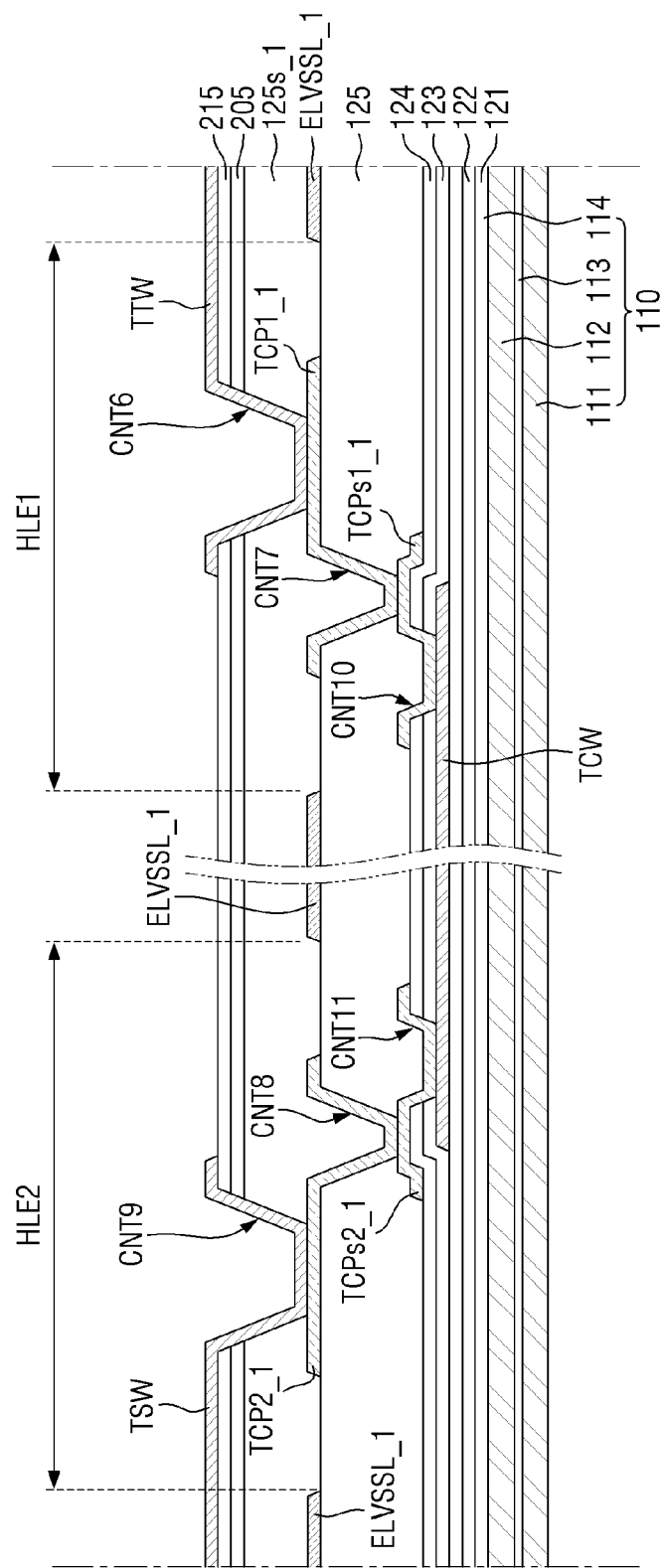
FIG. 19 is a cross-sectional view of another embodiment of a periphery of a touch connection line of a display device.

FIG. 18 is a cross-sectional view of another embodiment of one pixel of a display area of a display device. FIG. 19 is a cross-sectional view of another embodiment of a periphery of a touch connection line of a display device.

Referring to FIGS. 18 and 19, a display panel 10_1 of the display device in the illustrated embodiment is different from the display panel 10 of the embodiment of FIG. 11 in that it further includes a second data conductive layer 160s_1.

Specifically, the display panel 10_1 in the illustrated embodiment may include a first data conductive layer 160 and a second data conductive layer 160s_1. The first data conductive layer 160 of the illustrated embodiment has substantially the same configuration as the data conductive layer 160 of an embodiment.

The second data conductive layer 160s_1 may be disposed on the fourth insulating layer 125, and may be in contact with the second electrode 162 of the TFT of the first data conductive layer 160 through a contact hole. A fifth insulating layer 125s_1 may be disposed on the second data conductive layer 160s_1, and the fifth insulating layer 125s_1 may cover the second data conductive layer 160s_1. The fifth insulating layer 125s_1 may include substantially the same material as that of the fourth insulating layer 125, and may be a via layer.

In this case, a first touch connection pattern TCP1_1, a second touch connection pattern TCP2_1, and a second power line ELVSSL_1 may include the second data conductive layer 160s_1. The first data conductive layer 160 may include a first sub-touch connection pattern TCPs1_1 and a second sub-touch connection pattern TCP2s_1.

The touch test line TTW may be in contact with the first touch connection pattern TCP1_1 through the sixth contact hole CNT6 penetrating through the fifth insulating layer 125s_1. The first touch connection pattern TCP1_1 may overlap the first sub-touch connection pattern TCPs1_1, and may be in contact with the first sub-touch connection pattern TCPs1_1 in the overlap area through the seventh contact hole CNT7 penetrating the first touch insulating layer 215, the base layer 205 and the fourth insulating layer 125 to expose the first sub-touch connection pattern TCPs1_1. In other words, the first touch connection pattern TCP1_1 may be physically and/or electrically connected to the first sub-touch connection pattern TCPs1_1 through the seventh contact hole CNT7.

The first sub-touch connection pattern TCPs1_1 may overlap the touch connection line TCW, and may be in contact with the touch connection line TCW in the overlap area through a tenth contact hole CNT10 penetrating the third insulating layer 124 and the second insulating layer 123 to expose the touch connection line TCW. In other words, the first sub-touch connection pattern TCPs1_1 may be physically and/or electrically connected to the touch connection line TCW through the tenth contact hole CNT10.

Accordingly, the touch test line TTW may be electrically connected to the touch connection line TCW through the first touch connection pattern TCP1_1 and the first sub-touch connection pattern TCPs1_1.

The touch signal line TSW may be in contact with the second touch connection pattern TCP2_1 through a ninth contact hole CNT9 penetrating the fifth insulating layer 125s_1. The second touch connection pattern TCP2_1 may overlap the second sub-touch connection pattern TCPs2_1, and may be in contact with the second sub-touch connection pattern TCPs2_1 in the overlap area through the eighth contact hole CNT8 penetrating the first touch insulating layer 215, the base layer 205, and the fourth insulating layer 125 to expose the second sub-touch connection pattern TCPs2_1. In other words, the second touch connection pattern TCP2_1 may be physically and/or electrically connected to the second sub-touch connection pattern TCPs2_1 through the eighth contact hole CNT8.

The second sub-touch connection pattern TCPs2_1 may overlap the touch connection line TCW, and may be in contact with the touch connection line TCW in the overlap area through an eleventh contact hole CNT11 penetrating the third insulating layer 124 and the second insulating layer 123 to expose the touch connection line TCW. In other words, the second sub-touch connection pattern TCPs2_1 may be physically and/or electrically connected to the touch connection line TCW through the eleventh contact hole CNT11.

Accordingly, the touch signal line TSW may be electrically connected to the touch connection line TCW through the second touch connection pattern TCP2_1 and the second sub-touch connection pattern TCPs2_1.

Even in this case, the touch test line TTW and the touch signal line TSW may be electrically connected to each other, a coupling or short failure that may occur between the touch test line TTW and the touch signal line TSW may be suppressed or prevented, and tests of characteristics and aging of the touch member are possible. In addition, since the first data conductive layer 160 and the second data conductive layer 160s_1 are included, various designs of one pixel are possible while electrically connecting the touch test line TTW and the touch signal line TSW.

Figure 20:
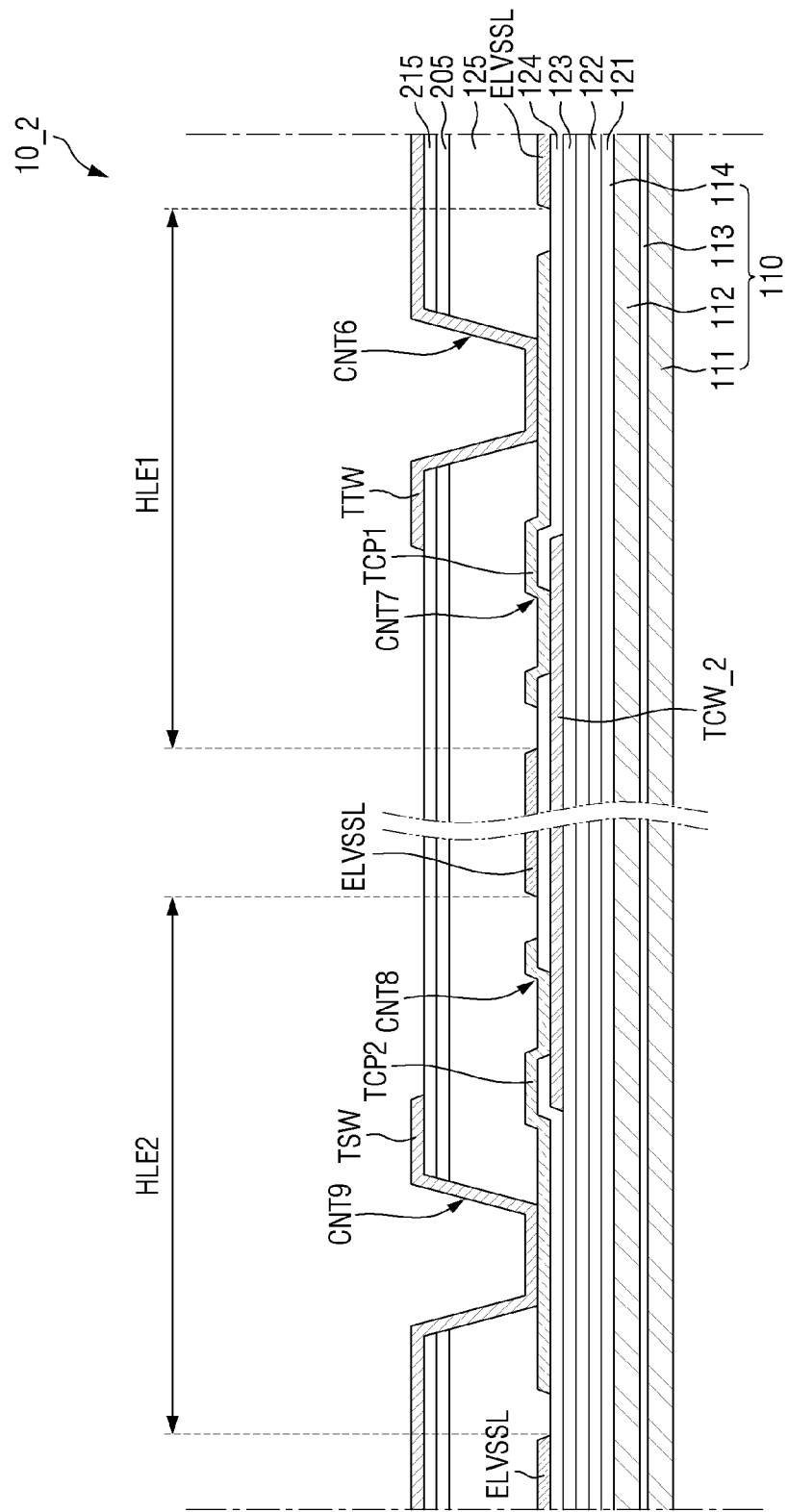
FIG. 20 is a cross-sectional view of another embodiment of a periphery of a touch connection line of a display device.

FIG. 20 is a cross-sectional view of another embodiment of a periphery of a touch connection line of a display device.

Referring to FIG. 20, a touch connection line TCW_2 of a display panel 10_2 in the illustrated embodiment is different from the embodiment of FIG. 14 in that the touch connection line TCW_2 includes the second gate conductive layer 150 (refer to FIG. 11). The touch connection line TCW_2 in the illustrated embodiment may be disposed on the second insulating layer 123, and may be in contact with the first touch connection pattern TCP1 and the second touch connection pattern TCP2 through the seventh contact hole CNT7 and the eighth contact hole CNT8 penetrating the third insulating layer 124, respectively.

Even in this case, the touch test line TTW and the touch signal line TSW may be electrically connected to each other, a coupling or short failure that may occur between the touch test line TTW and the touch signal line TSW) may be suppressed or prevented, and tests of characteristics and aging of the touch member are possible. In addition, since the touch connection line TCW_2 includes the second gate conductive layer 150 (refer to FIG. 11), the distance between the first touch connection pattern TCP1 and the second touch connection pattern TCP2 becomes close, and thus a contact may be made easier.

In concluding the detailed description, those skilled in the art will appreciate that many variations and modifications may be made to the preferred embodiments without substantially departing from the principles of the invention. Therefore, the disclosed preferred embodiments of the invention are used in a generic and descriptive sense only and not for purposes of limitation.

What is claimed is:

1. A display device, comprising:
a first area including a display area;
a second area including a pad area;
a bending area disposed between the first area and the second area;
a plurality of touch signal lines extending from the second area to the first area through the bending area;
a plurality of touch test lines disposed in the second area and separated and spaced apart from the plurality of touch signal lines; and
a plurality of touch connection lines electrically connecting the plurality of touch signal lines and the plurality of touch test lines,
wherein, in the second area, the plurality of touch signal lines and the plurality of touch test lines include a first conductive layer, and the plurality of touch connection lines includes a second conductive layer different from the first conductive layer.

2. The display device of claim 1, further comprising:
a plurality of first touch connection patterns electrically connecting the plurality of touch test lines and the plurality of touch connection lines; and
a plurality of second touch connection patterns electrically connecting the plurality of touch signal lines and the plurality of touch connection lines,
wherein, in the second area, the plurality of first touch connection patterns and the plurality of second touch connection patterns include a third conductive layer different from the first conductive layer and the second conductive layer.

3. The display device of claim 2,
wherein a first touch connection pattern of the plurality of first touch connection patterns overlaps a touch test line of the plurality of touch test lines and a touch connection line of the plurality of touch connection lines in a thickness direction, and a second touch connection pattern of the plurality of second touch connection patterns overlaps a touch signal line of the plurality of touch signal lines and the touch connection line in the thickness direction.

4. The display device of claim 3,
wherein each of the plurality of first touch connection patterns has an island shape, and each of the plurality of second touch connection patterns has an island shape.

5. The display device of claim 2, further comprising:
a second power line extending from the second area to the first area via the bending area,
wherein, in the second area, the second power line includes the third conductive layer.

6. The display device of claim 5,
wherein, in the second area, the second power line surrounds the plurality of first touch connection patterns and the plurality of second touch connection patterns.

7. The display device of claim 6,
wherein, in the second area, the plurality of touch signal lines and the plurality of touch connection lines overlap the second power line.

8. The display device of claim 2,
wherein, in the bending area, a touch signal line of the plurality of touch signal lines includes the third conductive layer, and in the second area, the touch signal line is electrically connected to the third conductive layer through a contact.

9. The display device of claim 1,
wherein the first conductive layer is a touch conductive layer, and the second conductive layer is a gate conductive layer.

10. The display device of claim 1,
wherein, in the second area, a touch connection line of the plurality of touch connection lines intersects a touch signal line of the plurality of touch signal lines in a plan view.

11. The display device of claim 1, further comprising:
a driving chip disposed on the second area,
wherein the plurality of touch signal lines is electrically connected to the driving chip.

12. A display device, comprising:
a first area including a display area;
a second area including a pad area;
a bending area disposed between the first area and the second area;
a plurality of touch signal lines extending from the second area to the first area through the bending area;
a plurality of touch test lines disposed in the second area and separated and spaced apart from the plurality of touch signal lines; and
a plurality of touch connection lines electrically connected to the plurality of touch signal lines and the plurality of touch test lines,
wherein, in the second area, the plurality of touch signal lines intersect the plurality of touch connection lines, and do not intersect the plurality of touch test lines in a plan view.

13. The display device of claim 12,
wherein, in the second area, the plurality of touch signal lines and the plurality of touch test lines include a first conductive layer, and the plurality of touch connection lines includes a second conductive layer different from the first conductive layer.

14. The display device of claim 13,
wherein the first conductive layer is a touch conductive layer, and the second conductive layer is a gate conductive layer.

15. The display device of claim 12, further comprising:
a driving chip disposed on the second area,
wherein the plurality of touch signal lines is electrically connected to the driving chip.

16. A display device, comprising:
a first area including a display area;
a second area including a pad area;
a bending area disposed between the first area and the second area;
a plurality of touch signal lines extending from the second area to the first area through the bending area;
a plurality of touch test lines disposed in the second area and separated and spaced apart from the plurality of touch signal lines; and
a plurality of touch connection lines electrically connecting the plurality of touch signal lines and the plurality of touch test lines,
wherein the display device comprises:
a substrate;
a gate conductive layer disposed on the substrate;
a first insulating layer disposed on the gate conductive layer;
a data conductive layer disposed on the first insulating layer;
a second insulating layer disposed on the data conductive layer; and
a touch conductive layer disposed on the second insulating layer,
wherein, in the second area, the plurality of touch signal lines and the plurality of touch test lines include the touch conductive layer, and the plurality of touch connection lines includes the gate conductive layer.

17. The display device of claim 16, further comprising:
a plurality of first touch connection patterns electrically connecting the plurality of touch test lines and the plurality of touch connection lines; and
a plurality of second touch connection patterns electrically connecting the plurality of touch signal lines and the plurality of touch connection lines,
wherein the plurality of first touch connection patterns and the plurality of second touch connection patterns include the data conductive layer.

18. The display device of claim 17,
wherein a first touch connection pattern of the plurality of first touch connection patterns overlaps a touch test line of the plurality of touch test lines and a touch connection line of the plurality of touch connection lines in a thickness direction, and a second touch connection pattern of the plurality of second touch connection patterns overlaps a touch signal line of the plurality of touch signal lines and the touch connection line in the thickness direction.

19. The display device of claim 18,
wherein each of the plurality of first touch connection patterns has an island shape, and each of the plurality of second touch connection patterns has an island shape.

20. The display device of claim 16, further comprising:
a driving chip disposed on the second area,
wherein the plurality of touch signal lines are electrically connected to the driving chip.

* * * * *